United States Patent
Lee et al.

(10) Patent No.: US 12,532,478 B2
(45) Date of Patent: Jan. 20, 2026

(54) SEMICONDUCTOR DEVICES WITH IMPROVED PERFORMANCE AND RELIABILITY AND MANUFACTURING METHODS FOR THE SAME

(71) Applicant: Samsung Electronics Co., Ltd., Suwon-si (KR)

(72) Inventors: Kyunghwan Lee, Suwon-si (KR); Yongseok Kim, Suwon-si (KR); Hyuncheol Kim, Seoul (KR); Jongman Park, Hwaseong-si (KR); Dongsoo Woo, Seoul (KR); Minjun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 671 days.

(21) Appl. No.: 17/952,637

(22) Filed: Sep. 26, 2022

(65) Prior Publication Data

US 2023/0096214 A1  Mar. 30, 2023

(30) Foreign Application Priority Data

Sep. 29, 2021  (KR) .................. 10-2021-0128956

(51) Int. Cl.
*H10B 51/30*  (2023.01)
*H10B 12/00*  (2023.01)
*H10B 51/20*  (2023.01)
*H10D 64/27*  (2025.01)

(52) U.S. Cl.
CPC ............. *H10B 51/30* (2023.02); *H10B 12/20* (2023.02); *H10B 12/30* (2023.02); *H10B 51/20* (2023.02); *H10D 64/512* (2025.01)

(58) Field of Classification Search
CPC ........ H10B 12/20; H10B 12/30; H10B 12/34; H10B 51/20; H10B 51/30; H10D 64/512
See application file for complete search history.

(56) References Cited

U.S. PATENT DOCUMENTS

| 8,933,516 | B1 | 1/2015 | Wu et al. |
| 10,062,426 | B2 | 8/2018 | Karda et al. |
| 10,978,485 | B2 | 4/2021 | Lue |

(Continued)

FOREIGN PATENT DOCUMENTS

TW  202036873 A  10/2020

OTHER PUBLICATIONS

Taiwanese Office Action dated Sep. 11, 2023 for corresponding Taiwanese Application No. 111137007.

*Primary Examiner* — Matthew E Warren
(74) *Attorney, Agent, or Firm* — Fish & Richardson P.C.

(57) ABSTRACT

A semiconductor device includes a plurality of gate electrodes extending on a substrate in a first horizontal direction and each including first and second vertical extension sidewalls that are opposite to each other, a channel arranged on the first vertical extension sidewall of each gate electrode and including a vertical extension portion, a ferroelectric layer and a gate insulating layer that are sequentially located between the channel layer and the first vertical extension sidewall of each gate electrode, an insulating layer on the second vertical extension sidewall of each gate electrode, and a plurality of bit lines electrically connected to the channel layer and extending in a second horizontal direction that is different from the first horizontal direction.

12 Claims, 22 Drawing Sheets

(56) References Cited

U.S. PATENT DOCUMENTS

| | | | |
|---|---|---|---|
| 10,998,338 B2 | 5/2021 | Karda et al. | |
| 11,997,855 B2* | 5/2024 | Young | H10B 63/34 |
| 2020/0411553 A1 | 12/2020 | Zhang et al. | |
| 2021/0126013 A1 | 4/2021 | Lai et al. | |
| 2021/0134815 A1 | 5/2021 | Juengling | |
| 2021/0175254 A1 | 6/2021 | Van Houdt | |
| 2022/0102352 A1* | 3/2022 | Lee | H10B 12/395 |
| 2022/0199625 A1* | 6/2022 | Lee | H10B 12/34 |
| 2023/0008261 A1* | 1/2023 | Sharma | H10D 30/701 |

\* cited by examiner

SEMICONDUCTOR DEVICES WITH IMPROVED PERFORMANCE AND RELIABILITY AND MANUFACTURING METHODS FOR THE SAME

CROSS-REFERENCE TO RELATED APPLICATION

This application is based on and claims priority under 35 U.S.C. § 119 to Korean Patent Application No. 10-2021-0128956, filed on Sep. 29, 2021, in the Korean Intellectual Property Office, the disclosure of which is incorporated by reference herein in its entirety.

BACKGROUND

The inventive concepts relate to semiconductor devices and manufacturing methods thereof, and more particularly, to semiconductor devices including a ferroelectric transistor and manufacturing methods of the semiconductor devices.

A size of an individual fine circuit pattern for embodying a semiconductor device decreases according to downscaling of the semiconductor device. In particular, as a height of a capacitor included in a dynamic random access memory (DRAM) device increases, the difficulty of a process of forming a capacitor increases, and a refresh operation for solving a leakage current using the capacitor is required. Therefore, there is a limitation on an increase in the integration of a DRAM device and application of the DRAM device to a device operating with low power.

SUMMARY

Some example embodiments of the inventive concepts provide a semiconductor device including a ferroelectric transistor that is advantageous for improving integration.

Some example embodiments of the inventive concepts provide a manufacturing method of a semiconductor device including a ferroelectric transistor that is advantageous for improving integration.

According to some example embodiments of the inventive concepts, a semiconductor device may include a plurality of gate electrodes extending on a substrate in a first horizontal direction that is parallel to an upper surface of the substrate, wherein each gate electrode of the plurality of gate electrodes includes first and second vertical extension sidewalls that are opposite to each other, a channel layer on the first vertical extension sidewall of each gate electrode and including a vertical extension portion, a ferroelectric layer and a gate insulating layer that are sequentially located between the channel layer and the first vertical extension sidewall of each gate electrode, an insulating layer on the second vertical extension sidewall of each gate electrode, and a plurality of bit lines electrically connected to the channel layer and extending in a second horizontal direction that is different from the first horizontal direction and is parallel to the upper surface of the substrate.

According to some example embodiments of the inventive concepts, a semiconductor device may include a plurality of source lines extending on a substrate in a first horizontal direction that is parallel to an upper surface of the substrate, a plurality of bit lines extending in a second horizontal direction at a higher vertical level than the source lines in a vertical direction that is perpendicular to the upper surface of the substrate, and a plurality of ferroelectric transistors arranged at cross points of the source lines and the bit lines, wherein each ferroelectric transistor of the ferroelectric transistors includes a gate electrode extending in the first horizontal direction, a ferroelectric layer on a sidewall of the gate electrode, a gate insulating layer on a sidewall of the ferroelectric layer, and a channel layer on a sidewall of the gate insulating layer, wherein the plurality of ferroelectric transistors include a first and second ferroelectric transistors, which are adjacent to each other in the second horizontal direction and are mirror-symmetrical with respect to each other.

According to some example embodiments of the inventive concepts, a semiconductor device may include a plurality of source lines extending on a substrate in a first horizontal direction that is parallel to an upper surface of the substrate, an insulating layer on the plurality of source lines, the insulating layer including a plurality of first sidewalls and a plurality of second sidewalls that oppose separate, respective first sidewalls of the plurality of first sidewalls to at least partially define separate, respective openings of a plurality of openings that extend in the first horizontal direction, a plurality of first ferroelectric transistors that are on separate, respective first sidewalls of the plurality of first sidewalls that at least partially define separate, respective openings of the plurality of openings, each first ferroelectric transistor of the plurality of first ferroelectric transistors including a first gate electrode, a first ferroelectric layer, a first gate insulating layer, and a first channel layer, a plurality of second ferroelectric transistors that are on separate, respective second sidewalls of the plurality of second sidewalls that at least partially define separate, respective openings of the plurality of openings, each second ferroelectric transistor of the plurality of second ferroelectric transistors including a second gate electrode, a second ferroelectric layer, a second gate insulating layer, and a second channel layer, and a plurality of bit lines extending in a second horizontal direction, each bit line of the plurality of bit lines electrically connected to a separate and respectively and electrically connected to a separate set of first and second ferroelectric transistors of the plurality of first ferroelectric transistors and the plurality of second ferroelectric transistors, wherein each separate set of first and second ferroelectric transistors are mirror symmetrical with respect to each other.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
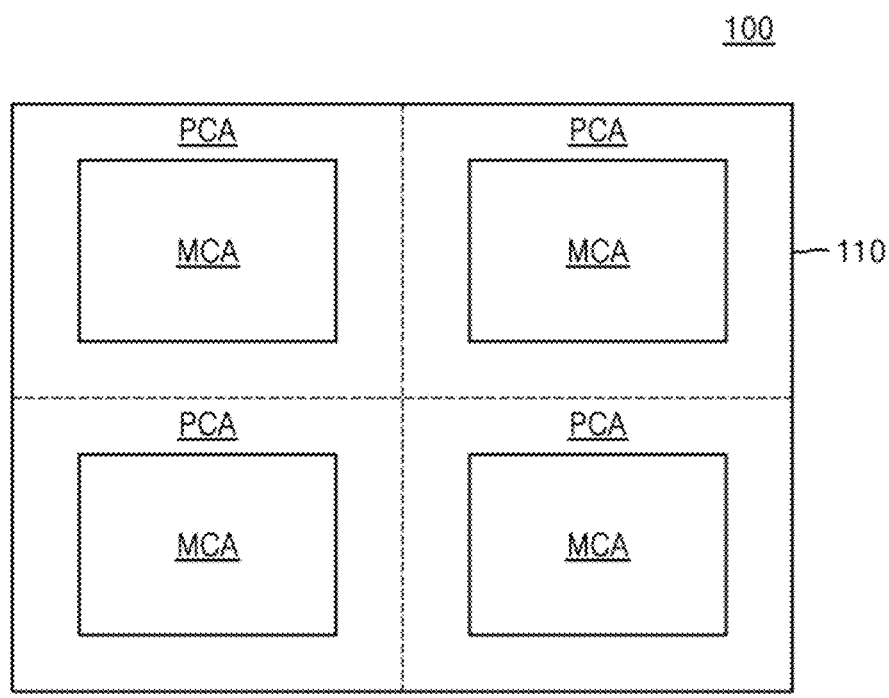
FIG. 1 illustrates a layout of a semiconductor device according to some example embodiments.

Hereinafter, some example embodiments of the inventive concepts will be described in detail with reference to the attached drawings. In the description of FIGS. 1 to 22, the same reference numerals are used for substantially the same components, and duplicate descriptions of the corresponding components will be omitted. Also, similar reference numerals are used for similar components throughout various drawings of the present inventive concepts.

It will be understood that when an element such as a layer, film, region, or substrate is referred to as being "on" another element, it may be directly on the other element or intervening elements may also be present. For example, when an element is on another element and intervening elements are present, the element may be on and further spaced apart from (e.g., isolated from direct contact with) the other element, also referred to as being "indirectly" on the other element. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

Figure 2:
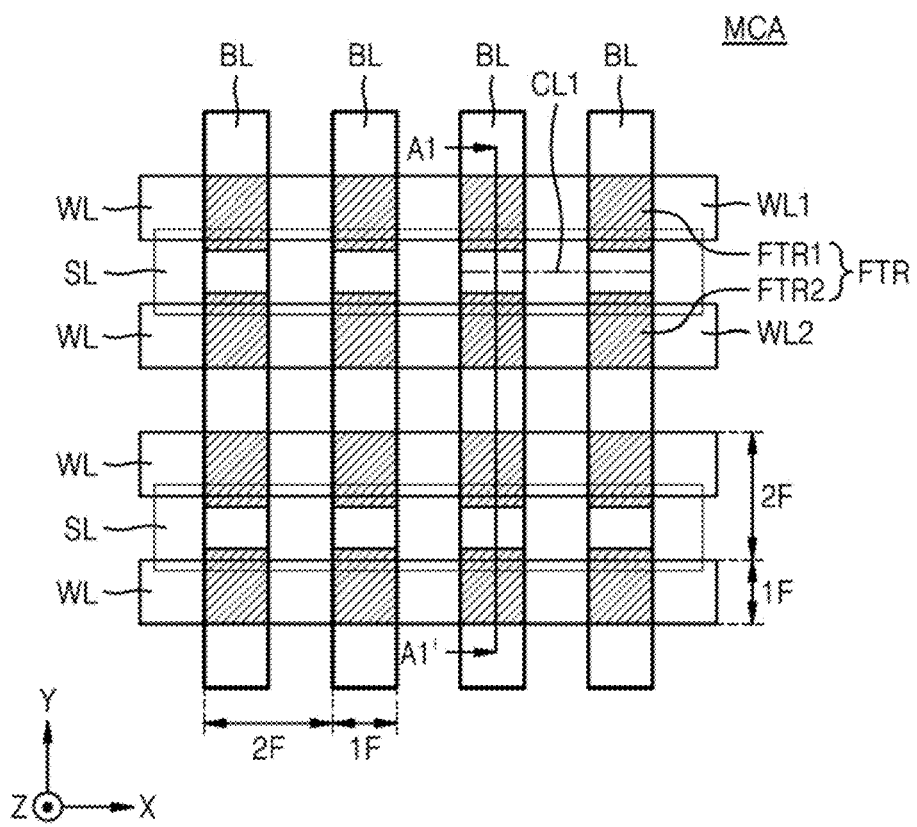
FIG. 2 illustrates an enlarged layout of a cell array area of FIG. 1.
Figure 3:
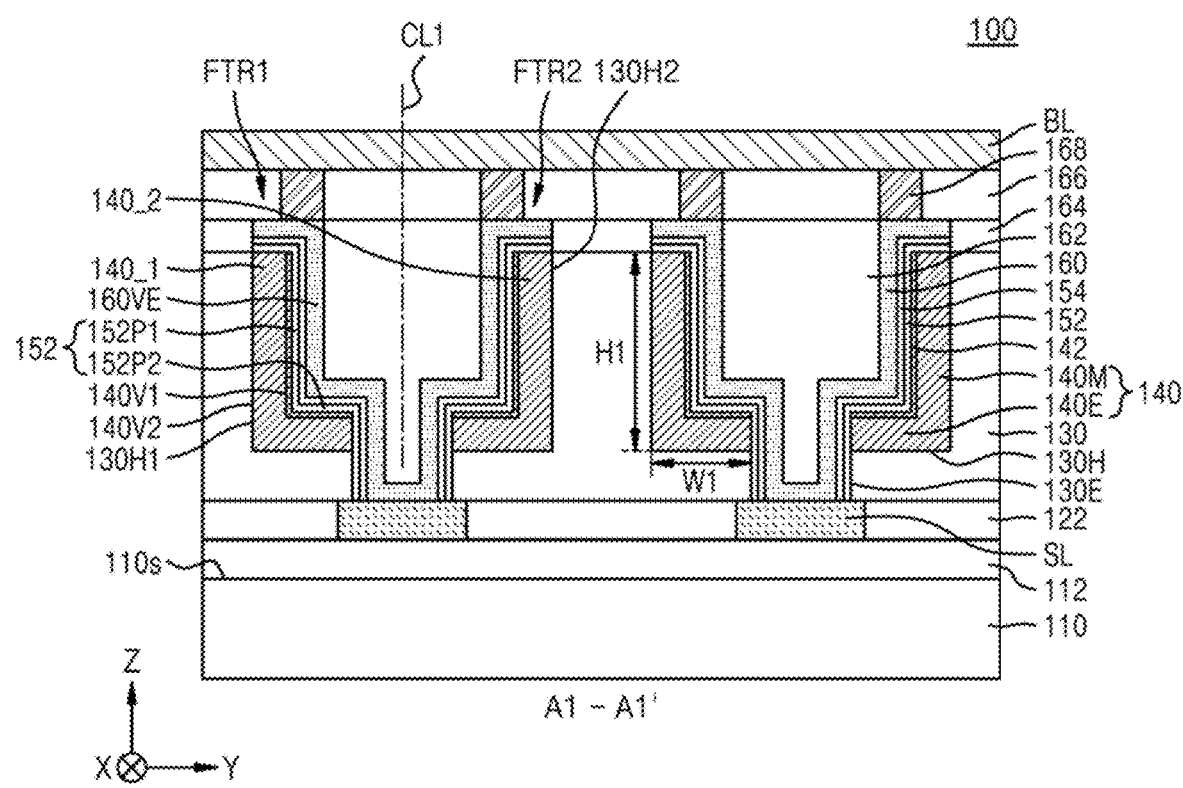
FIG. 3 is a cross-sectional view of a semiconductor device taken along line A1-A1' of FIG. 2.

FIG. 1 illustrates a layout of a semiconductor device 100 according to some example embodiments. FIG. 2 illustrates an enlarged layout of a cell array area MCA of FIG. 1. FIG. 3 is a cross-sectional view of the semiconductor device 100 taken along line A1-A1' of FIG. 2.

Referring to FIGS. 1 to 3, the semiconductor device 100 may include a substrate 110 including the cell array area MCA and a peripheral circuit area PCA. In some embodiments, the cell array area MCA may be a memory cell area of a ferroelectric memory device, and the peripheral circuit area PCA may be a core area or a peripheral circuit area of the ferroelectric memory device. For example, the peripheral circuit area PCA may include a peripheral circuit transistor (not illustrated) configured to transmit signals and/or power to a memory cell array included in the cell array area MCA. In some example embodiments, the peripheral circuit transistor (not illustrated) may configure various circuits such as a command decoder, a control logic, an address buffer, a row decoder, a column decoder, a sense amplifier, and a data input/output circuit.

As illustrated in FIG. 2, in the cell array area MCA of the substrate 110, a plurality of word lines WL extending in a first horizontal direction X and a plurality of bit lines BL extending in a second horizontal direction Y may be arranged. At separate, respective (e.g., different) cross points in which the plurality of word lines WL cross the plurality of bit lines BL, a plurality of ferroelectric transistors FTR may be arranged (e.g., located). The cross points may be understood to be points at which at least one source line SL and at least one bit line BL overlap in the vertical direction Z (e.g., vertically overlap), such that the ferroelectric transistors FTR, being located at separate, respective cross points, may each overlap at least one source line SL and at least one bit line BL in the vertical direction Z.

The plurality of word lines WL may include first word lines WL1 and second word lines WL2 that are alternately arranged in the second horizontal direction Y, and the plurality of ferroelectric transistors FTR may include a first ferroelectric transistor FTR1 and a second ferroelectric transistor FTR2 that are alternately arranged in the second horizontal direction Y. The first ferroelectric transistor FTR1 may be arranged on the first word line WL1, and the second ferroelectric transistor FTR2 may be arranged on the second word line WL2.

The first ferroelectric transistor FTR1 and the second ferroelectric transistor FTR2 may have a mirror symmetry structure with respect to each other (e.g., may be mirror-symmetrical with respect to each other, may be mirror-symmetrical across a center line, etc.). For example, the first ferroelectric transistor FTR1 and the second ferroelectric transistor FTR2 may have a mirror symmetry structure (e.g., may be mirror-symmetrical, may have mirror symmetry, etc.) with respect to a center line CL1 extending in the first horizontal direction X between the first ferroelectric transistor FTR1 and the second ferroelectric transistor FTR2.

A source line SL extending in the first horizontal direction X may be arranged between the first and second word lines WL1 and WL2. One source line SL may vertically overlap at least a portion of the first ferroelectric transistor FTR1 and at least a portion of the second ferroelectric transistor FTR2. In some example embodiments shown in FIG. 2, the number of source lines SL may be half of the number of word lines WL, and two word lines WL (that is, the first word line WL1 and the second word line WL2) may commonly correspond to one source line SL. In other embodiments, however, the number of source lines SL may be identical to the number of word lines WL, and one source line SL may correspond to one word line WL.

In some example embodiments, widths of the word lines WL may be 1F, pitches (that is, a sum of a width and a gap) of the word lines WL may be 2F, widths of the bit lines BL may be 1F, pitches (that is, a sum of a width and a gap) of the bit lines BL may be 2F, and a unit area for forming one ferroelectric transistor FTR may be $4F^2$. Therefore, because the ferroelectric transistor FTR may be of a crosspoint type that requires a relatively small unit area, it may be advantageous for improving the integration of the semiconductor device 100.

As illustrated in FIG. 3, a lower insulating layer 112 may be arranged on the substrate 110. The substrate 110 may include silicon such as single crystalline silicon, polycrystalline silicon, or amorphous silicon. In other embodiments, the substrate 110 may include at least one of germanium (Ge), silicon-germanium (SiGe), silicon carbide (SiC), gallium arsenide (GaAs), indium arsenide (InAs), and indium phosphide (InP). In some embodiments, the substrate 110 may include a conductive area, for example, a well doped with impurities or a structure doped with impurities. The lower insulating layer 112 may include an oxide layer, a nitride layer, or a combination thereof.

On the lower insulating layer 112, the source lines SL extending in the first horizontal direction X may be arranged. A source line insulating layer 122 may be arranged on a sidewall of the source line SL. In some example embodiments, the source line SL may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), polysilicon, or a combination thereof.

A first insulating layer 130 may be arranged on the source line SL and the source line insulating layer 122. The first insulating layer 130 may include (e.g., as shown in at least FIGS. 2-3, may have one or more inner surfaces and/or sidewalls at least partially defining) a plurality of openings 130H extending in the first horizontal direction X. The plurality of openings 130H may include a first sidewall 130H1 and a second sidewall 130H2 that are opposite to each other (e.g., are opposing sidewalls that face each other). The first sidewall 130H1 and a second sidewall 130H2 may in some example embodiments be understood to be respective sidewalls of the first insulating layer 130 that at least partially define one or more openings of the plurality of openings 130H. Each opening 130H may include a bottom opening 130E extending in the first horizontal direction X, and an upper surface of the source line SL may be exposed at a bottom portion of the bottom opening 130E. The first insulating layer 130 may include at least one of silicon oxide, silicon nitride, and silicon oxynitride.

A plurality of gate electrodes 140 may be arranged on the first sidewalls 130H1 and the second sidewalls 130H2 of the openings 130H. In some example embodiments, the gate electrodes 140 may each include Ti, TiN, Ta, TaN, W, WN, TiSiN, WSiN, polysilicon, or a combination thereof.

For example, the gate electrodes 140 may include a first gate electrode 140_1 and a second gate electrode 140_2 that are alternately arranged in the second horizontal direction Y, the first gate electrode 140_1 may be arranged on the first sidewall 130H1 of the opening 130H, and the second gate electrode 140_2 may be arranged on the second sidewall 130H2 of the opening 130H.

In some example embodiments, the first gate electrode 140_1 and the second gate electrode 140_2 may have a mirror symmetry structure with respect to the center line CL1 (e.g., have mirror symmetry across center line CL1, are mirror-symmetrical with respect to center line CL1, etc.). For example, the first gate electrode 140_1 may have an L-shaped vertical cross-section (e.g., a cross-section parallel to a Y-Z plane), and the second gate electrode 140_2 may have a vertical cross-section that is mirror-symmetrical to the L shape.

In some example embodiments, each gate electrode 140 may include a main gate portion 140M and a horizontal extension portion 140E. The main gate portion 140M may extend on the first sidewall 130H1 in a vertical direction Z, and the horizontal extension portion 140E may be connected to a lower portion of the main gate portion 140M and extend in the second horizontal direction Y. The main gate portion 140M may include a first vertical extension sidewall 140V1 and a second vertical extension sidewall 140V2 that extend in the vertical direction Z and are opposite to each other. The second vertical extension sidewall 140V2 may contact the first insulating layer 130 and extend in the first horizontal direction X.

As described herein, the first and second horizontal directions X and Y may each be understood be parallel to an upper surface 110s of the substrate 110, and the vertical direction Z may be understood to be perpendicular to the upper surface 110s of the substrate 110. Accordingly, the vertical direction Z may be understood to be perpendicular to the first and second horizontal directions X and Y. Additionally, it will be understood that the first and second horizontal directions X and Y may be different from each other. For example, the first and second horizontal directions X and Y may be perpendicular to each other as shown in at least FIGS. 2-3.

On the first vertical extension sidewall 140V1 of each gate electrode 140, a ferroelectric layer 152, a gate insulating layer 154, and a channel layer 160 may be sequentially arranged. A barrier layer 142 may be arranged between each gate electrode 140 and the ferroelectric layer 152. A second insulating layer 162 filling a remaining space of the opening 130H may be arranged on the channel layer 160, and a third insulating layer 164 may be arranged on an upper surface of the first insulating layer 130.

As illustrated in FIG. 3, the ferroelectric layer 152, the gate insulating layer 154, and the channel layer 160 may be arranged on an upper surface of the main gate portion 140M and the first vertical extension sidewall 140V1 of each gate electrode 140, extend on an upper surface and a sidewall of the horizontal extension portion 140E, and extend on an inner wall of the bottom opening 130E of the opening 130H. The channel layer 160 may cover the upper surface of the source line SL exposed at the bottom portion of the bottom opening 130E.

In some example embodiments, the ferroelectric layer 152 may include a first portion 152P1 and a second portion 152P2, the first portion 152P1 may extend on the first vertical extension sidewall 140V1 in the vertical direction Z, and the second portion 152P2 may extend on the upper surface of the horizontal extension portion 140E in the second horizontal direction Y.

As illustrated in FIG. 3, the channel layer 160 may include a vertical extension portion 160VE. The first portion 152P1 of the ferroelectric layer 152 and the gate insulating layer 154 may be sandwiched between the vertical extension portion 160VE of the channel layer 160 and the first vertical extension sidewall 140V1 of each gate electrode 140 and may extend in the vertical direction Z.

In some example embodiments, the gate electrodes 140 may have an asymmetrical gate structure. Here, the term "asymmetrical gate structure" may indicate that each gate electrode 140 may have an asymmetrical shape in the second horizontal direction Y and may also indicate that only the first vertical extension sidewall 140V1 among the first and second vertical extension sidewalls 140V1 and 140V2 is arranged to face the vertical extension portion 160VE of the channel layer 160 and only the first vertical extension sidewall 140V1 functions as an effective gate electrode area. Also, the vertical extension portion 160VE of the channel layer 160 may function as a channel area of the ferroelectric transistor FTR.

In some example embodiments, each gate electrode 140 may have a first width W1 in the second horizontal direction Y and a first height H1 in the vertical direction Z. A ratio of the first height H1 to the first width W1 of each gate electrode 140 may be between about 1 and about 10. For example, each gate electrode 140 may have a relatively large ratio of the first height H1 to the first width W1. Accordingly, the vertical extension portion 160VE of the channel layer 160 may also have a relatively great height, and an effective area of the channel area of the ferroelectric transistor FTR may also be relatively great.

In some example embodiments, the ferroelectric layer 152 may include a material having ferroelectricity and maintaining spontaneous polarization as electric dipole moments are aligned in the ferroelectric layer 152. The ferroelectric transistor FTR may operate in a manner that data is stored by using a phenomenon in which a threshold voltage of the ferroelectric transistor FTR changes according to a direction of polarization remaining in the ferroelectric layer 152 and the data is sensed. For example, a state, in which the ferroelectric transistor FTR has a first threshold voltage Vth1 that is relatively low, is designated as data 1, and a state, in which the ferroelectric transistor FTR has a second threshold voltage Vth2 that is relatively high, is designated as data 0. When a read voltage, which is higher than the first threshold voltage Vth1 and lower than the second threshold voltage Vth2, is applied, data may be stored/read as a value of a current flowing in the ferroelectric transistor FTR is sensed.

In some example embodiments, the ferroelectric layer 152 may include hafnium-based oxide having an orthorhombic crystal structure, and for example, the hafnium-based oxide may include an o-phase having an orthorhombic crystal structure. In some example embodiments, the ferroelectric layer 152 may include hafnium oxide ($HfO_2$) and may further include impurities including metal elements. For example, the ferroelectric layer 152 may include a ferroelectric material having the chemical formula of $Hf_xM_{1-x}O_y$, ($0<x<1$, $2 \le y \le 4$, and M is at least one of zirconium (Zr), silicon (Si), aluminum (Al), yttrium (Y), gadolinium (Gd), lanthanum (La), scandium (Sc), and strontium (Sr)). For example, the ferroelectric layer 152 may include hafnium oxide (HfOx) doped with Al of about 3 mol % to about 8 mol %, Si of about 2 mol % to about 10 mol %, Y of about 2 mol % to about 10 mol %, or Gd of about 1 mol % to about 7 mol %. In some embodiments, the ferroelectric layer 152 may include $Hf_xZr_{1-x}O_y$, ($0.2 \le x \le 0.8$ and $2 \le y \le 4$). In some example embodiments, a thickness of the ferroelectric layer 152 including HfOx may be less than or equal to about 10 nm.

In some example embodiments, the gate insulating layer 154 may include silicon oxide, silicon nitride, silicon oxynitride, a high-k dielectric material, or a combination thereof. The channel layer 160 may include at least one of polysilicon, Si—Ge, Ge, InGaZnO$_x$ (IGZO), Sn-doped IGZO, W-doped InO$_x$ (IWO), InZnO$_x$ (IZO), ZnSnO$_x$(ZTO), YZnO$_x$ (YZO), copper sulfide ($CuS_2$), copper diselenide ($CuSe_2$), molybdenum disulfide ($MoS_2$), molybdenum diselenide ($MoSe_2$), tungsten diselenide ($WSe_2$), and tungsten disulfide ($WS_2$). The barrier layer 142 may include at least one of TiN, TaN, titanium aluminide (TiAl), and titanium aluminum carbide (TiAlC).

A fourth insulating layer 166 may be arranged on the third insulating layer 164, and the bit lines BL may extend on the fourth insulating layer 166 in the second horizontal direction Y. A bit line contact 168 penetrating the fourth insulating layer 166 may be electrically connected to the channel layer 160, and the bit lines BL may be arranged on the bit line contact 168. In some example embodiments, the bit lines BL and the bit line contact 168 may each include Ti, TiN, Ta, TaN, W, WN, TiSiN, WSiN, polysilicon, or a combination thereof.

The first gate electrode 140_1 and respective portions of the ferroelectric layer 152, the gate insulating layer 154, and the channel layer 160, which are arranged on the first gate electrode 140_1, may be referred to as the first ferroelectric transistor FTR1, and the second gate electrode 140_2 and respective portions of the ferroelectric layer 152, the gate insulating layer 154, and the channel layer 160, which are arranged on the second gate electrode 140_2, may be referred to as the second ferroelectric transistor FTR2. For example, the first ferroelectric transistor FTR1 may be arranged on the first sidewall 130H1 of the opening 130H, and the second ferroelectric transistor FTR2 may be arranged on the second sidewall 130H2 of the opening 130H. With respect to the center line CL1, the first ferroelectric transistor FTR1 and the second ferroelectric transistor FTR2 may have a mirror symmetry shape with respect to each other.

In some example embodiments, it may be understood that the first insulating layer 130 may include a plurality of first sidewalls (e.g., first sidewalls 130H1) and a plurality of second sidewalls that oppose separate, respective first sidewalls of the plurality of sidewalls (e.g., the second sidewalls 130H2) to at least partially define separate, respective openings of a plurality of openings that extend in the first horizontal direction (e.g., openings 130H), where the plurality of first ferroelectric transistors FTR1 are on separate, respective first sidewalls of the plurality of first sidewalls that at least partially define separate, respective openings of the plurality of openings (e.g., on separate, respective first sidewalls 130H1), and a plurality of second ferroelectric transistors FTR2 that are on separate, respective second sidewalls of the plurality of second sidewalls (e.g., on separate, respective second sidewalls 130H2).

In general, a dynamic random access memory (DRAM) device may have a 1T-1C structure including a cell transistor and a capacitor, and in particular, a process of forming a capacitor thereof may be highly complicated, and the amount of power consumed during a refresh operation, etc. thereof may be relatively great.

According to some example embodiments, however, the ferroelectric transistor FTR may be configured to store data using residual polarization formed in the ferroelectric layer 152 and may form a non-volatile memory device having a 1T structure that does not require a separate capacitor configured to store data. Therefore, a leakage current, a floating body effect, etc. may be prevented in the semiconductor device 100, and the semiconductor device 100 may be driven with relatively low power. Also, as the gate electrodes 140 having an asymmetrical gate structure and the ferroelectric layer 152 and the channel layer 160 arranged on the first vertical extension sidewall 140V1 of the gate electrode 140 form the ferroelectric transistor FTR, it may be advantageous for performing scaling in the vertical direction Z and improve the integration of the semiconductor device 100.

Figure 4:
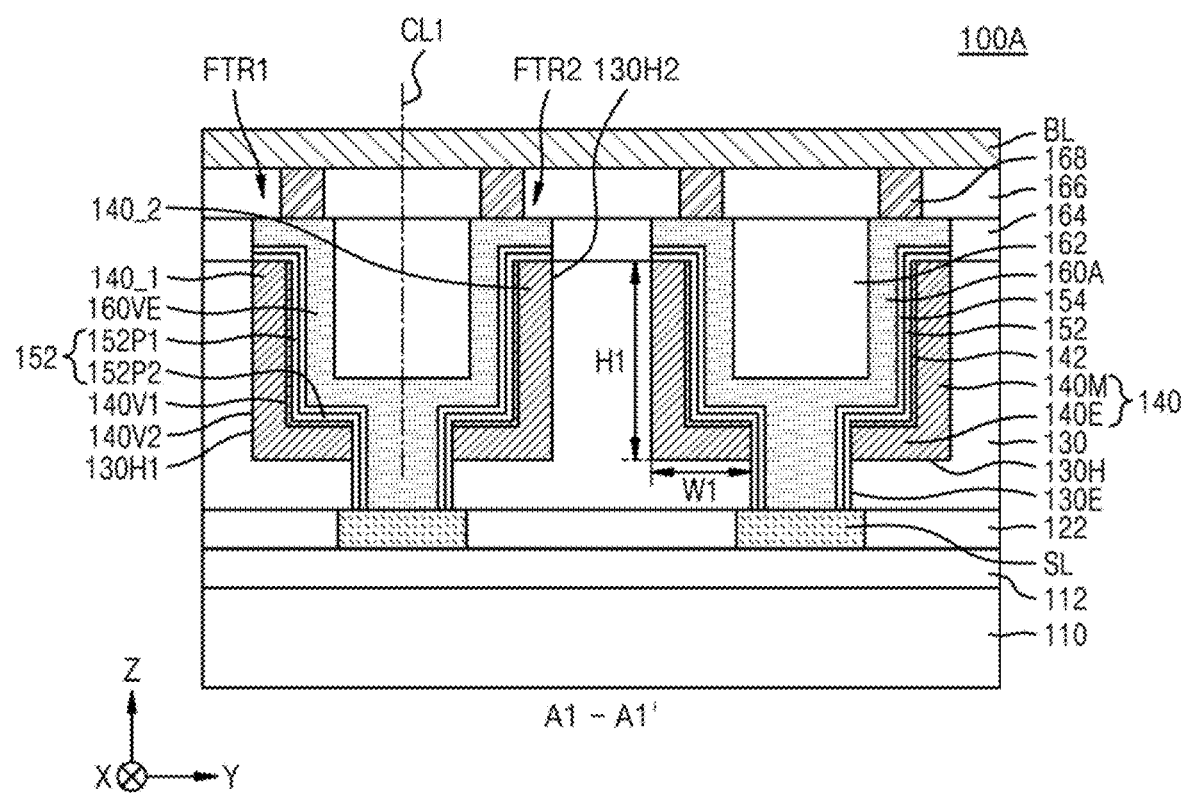
FIG. 4 is a cross-sectional view of a semiconductor device according to some example embodiments.

FIG. 4 is a cross-sectional view of a semiconductor device 100A according to some example embodiments. The same reference symbols in FIGS. 1 to 4 denote the same elements.

Referring to FIG. 4, a channel layer 160A may have a relatively great thickness to completely fill the bottom opening 130E of the opening 130H. Accordingly, a portion of the channel layer 160A, which is in the bottom opening 130E, may provide electrical connection between the source line SL and the first ferroelectric transistor FTR1 and between the source line SL and the second ferroelectric transistor FTR2. For example, a portion of the channel layer 160A, which is in the bottom opening 130E, may function as a common source contact.

Figure 5:
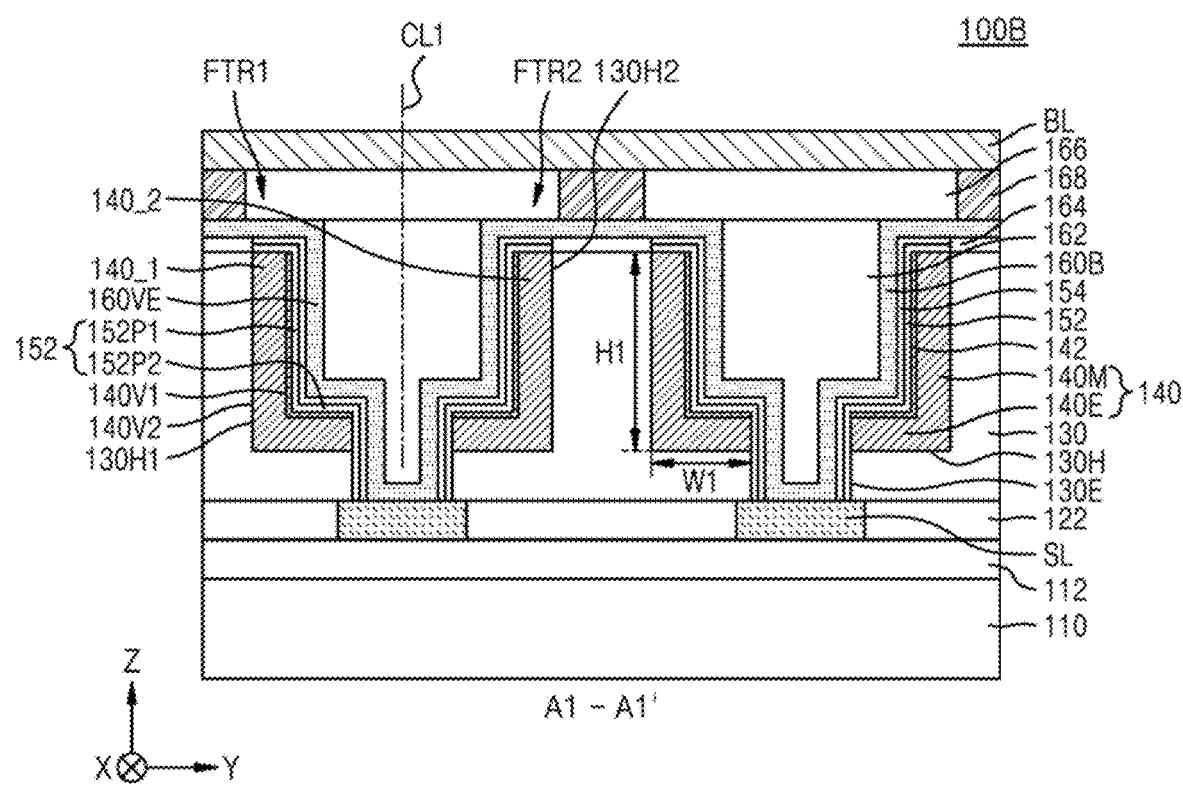
FIG. 5 is a cross-sectional view of a semiconductor device according to some example embodiments.

FIG. 5 is a cross-sectional view of a semiconductor device 100B according to some example embodiments. The same reference symbols in FIGS. 1 to 5 denote the same elements.

Referring to FIG. 5, a channel layer 160B may be in one opening 130H, extend on an upper surface of the third insulating layer 164, and be connected to a portion of the channel layer 160B that is arranged in an adjacent opening 130H. The bit line contact 168 may be arranged on a portion of the channel layer 160B that is on the upper surface of the third insulating layer 164. The bit line contact 168 may provide electrical connection between the bit line BL and the first ferroelectric transistor FTR1 arranged in one opening 130H and between the bit line BL and the second ferroelectric transistor FTR2 arranged in one opening 130H adjacent to the opening 130H above. For example, the bit line contact 168 may function as a common bit line contact.

Figure 6:
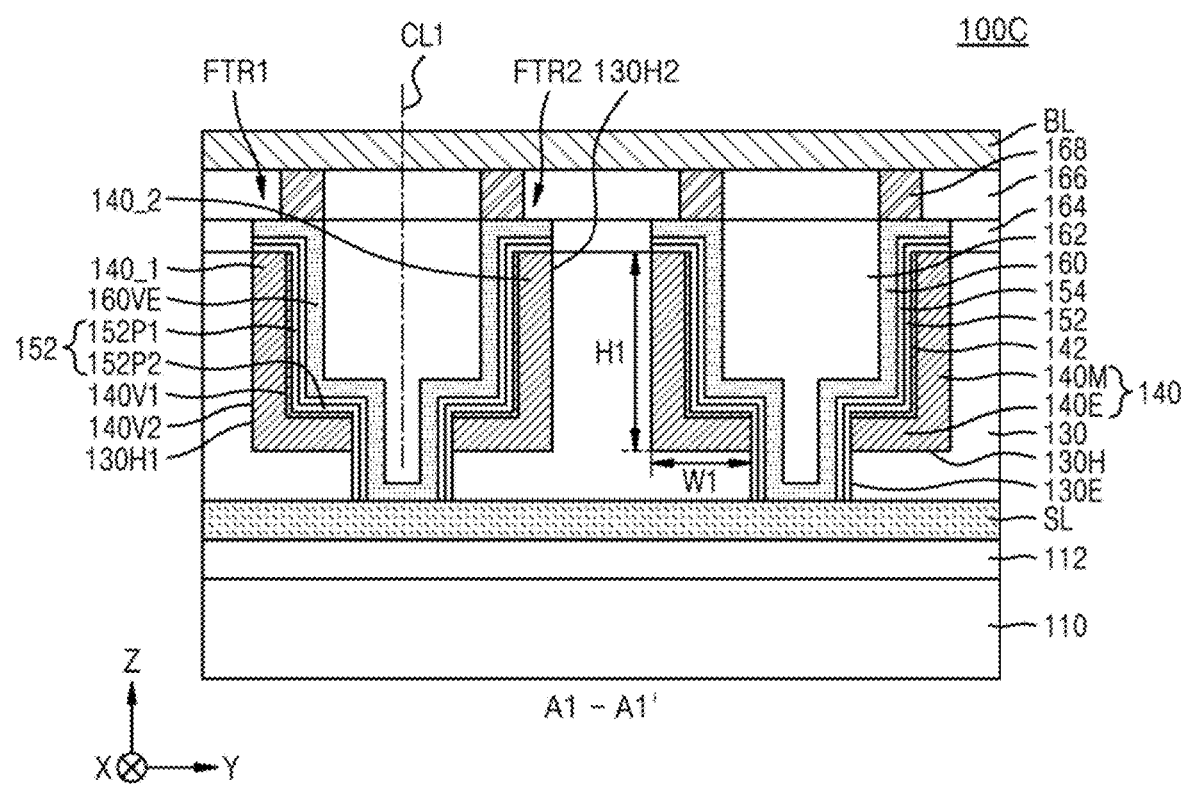
FIG. 6 is a cross-sectional view of a semiconductor device according to some example embodiments.

FIG. 6 is a cross-sectional view of a semiconductor device 100C according to some example embodiments. The same reference symbols in FIGS. 1 to 6 denote the same elements.

Referring to FIG. 6, the plurality of source lines SL may extend in the second horizontal direction Y, the plurality of gate electrodes 140 may extend on the source lines SL in the first horizontal direction X, and the plurality of bit lines BL may extend in the second horizontal direction Y. As the bit lines BL are arranged to be parallel to the source lines SL, an array of an AND type may be formed.

Figure 7:
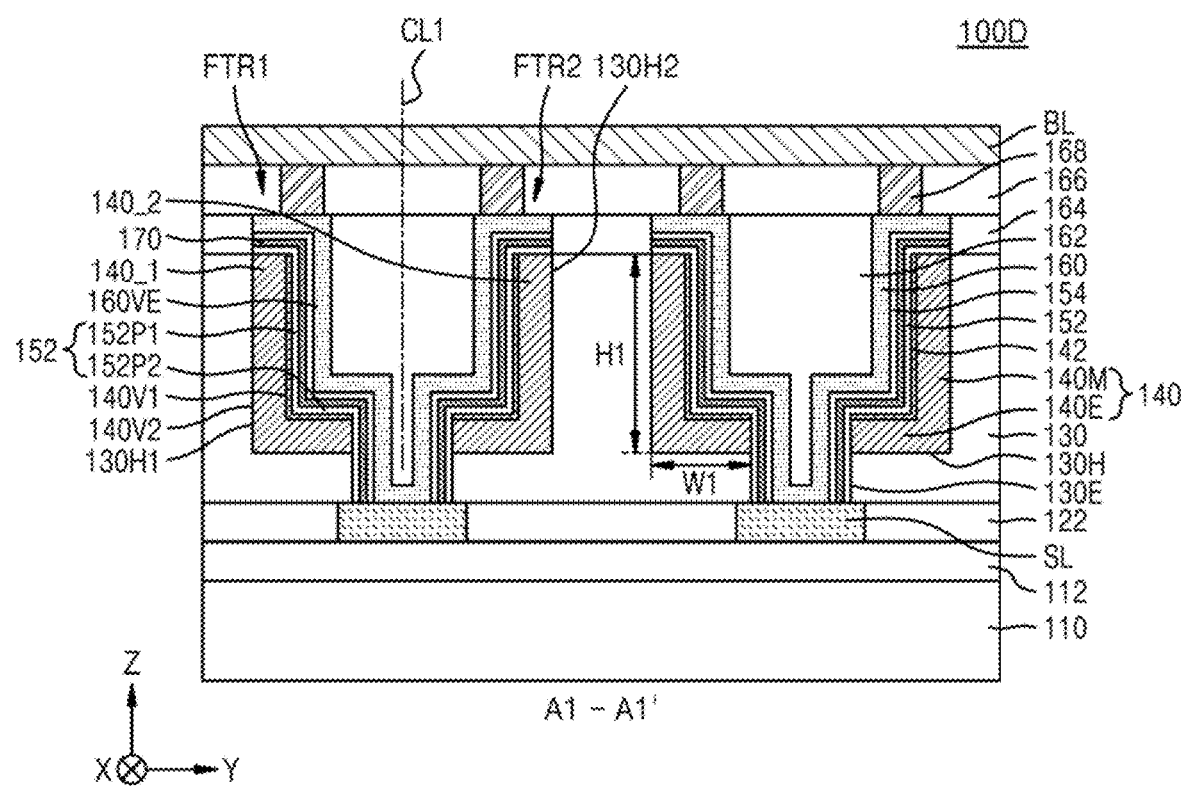
FIG. 7 is a cross-sectional view of a semiconductor device according to some example embodiments.

FIG. 7 is a cross-sectional view of a semiconductor device 100D according to some example embodiments. The same reference symbols in FIGS. 1 to 7 denote the same elements.

Referring to FIG. 7, the ferroelectric transistor FTR may further include a floating gate 170 arranged between the ferroelectric layer 152 and the gate insulating layer 154. In some example embodiments, the floating gate 170 may include doped polysilicon, Al, Cu, Ti, Ta, ruthenium (Ru), W, Mo, platinum (Pt), nickel (Ni), cobalt (Co), TiN, TaN, WN, niobium nitride (NbN), TiAl, TiAlN, TiSi, TiSiN, TaSi, TaSiN, RuTiN, NiSi, CoSi, iridium oxide ($IrO_x$), ruthenium oxide ($RuO_x$), or a combination thereof, but is not limited thereto.

The floating gate 170 may have a portion that vertically extends between the first vertical extension sidewall 140V1 of the gate electrode 140 and the vertical extension portion 160VE of the channel layer 160. For example, the floating gate 170 may have a thickness ranging from about 10 nm to about 50 nm, but is not limited thereto.

Figure 8:
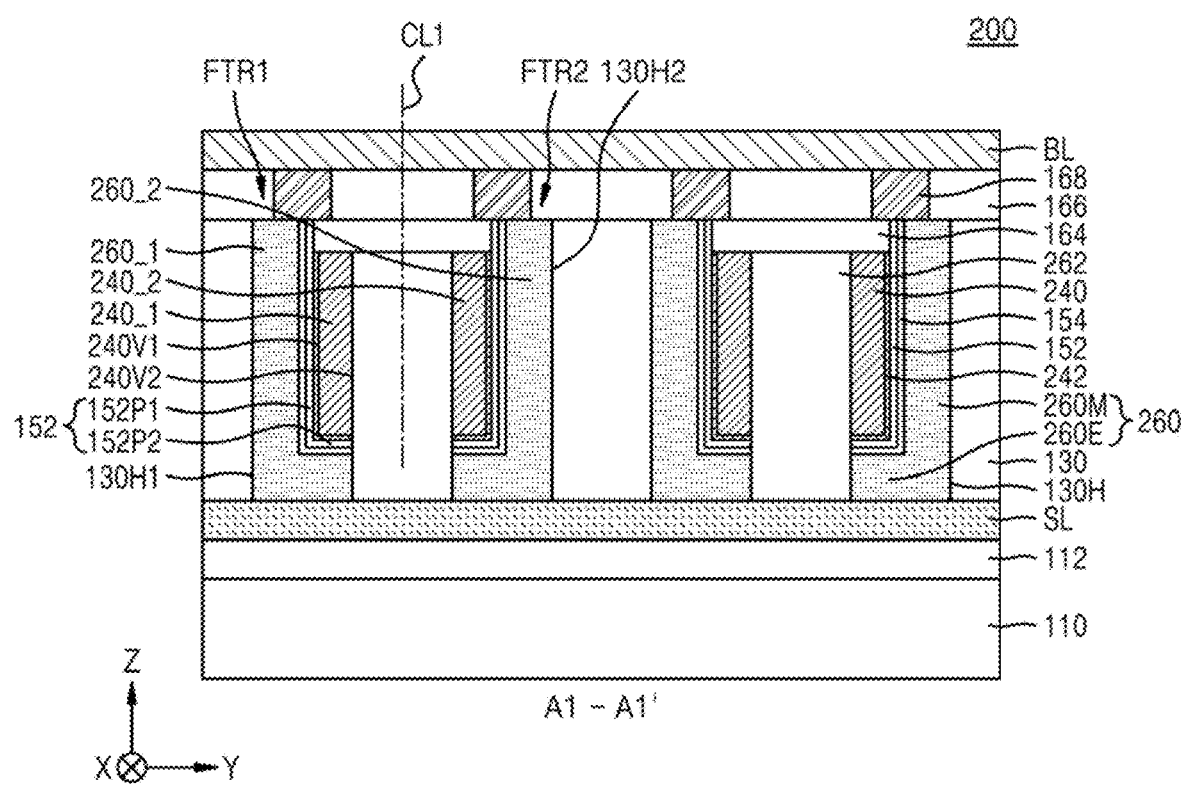
FIG. 8 is a cross-sectional view of a semiconductor device according to some example embodiments.

FIG. 8 is a cross-sectional view of a semiconductor device 200 according to some example embodiments. The same reference symbols in FIGS. 1 to 8 denote the same elements.

The plurality of source lines SL may extend on the substrate 110 in the second horizontal direction Y, and the plurality of ferroelectric transistors FTR may be apart from each other on the plurality of source lines SL in the first horizontal direction X and the second horizontal direction Y.

The first insulating layer 130 may include the plurality of openings 130H extending in the first horizontal direction X, and the plurality of openings 130H may include the first sidewall 130H1 and the second sidewall 130H2 that are opposite to each other.

Channel layers 260 may be on the first sidewall 130H1 and the second sidewall 130H2 of the openings 130H. For example, the channel layer 260 may include a first channel layer 260_1 and a second channel layer 260_2 that are alternately arranged in the second horizontal direction Y, the first channel layer 260_1 may be arranged on the first sidewall 130H1 of the openings 130H, and the second channel layer 260_2 may be arranged on the second sidewall 130H2 of the openings 130H.

In some example embodiments, the first channel layer 260_1 and the second channel layer 260_2 may have a mirror symmetry structure with respect to the center line CL1. For example, the first channel layer 260_1 may have an L-shaped vertical cross-section (e.g., a cross-section parallel to a Y-Z plane), and the second channel layer 260_2 may have a vertical cross-section that is mirror-symmetrical to the L shape.

In some example embodiments, each channel layer 260 may include a main channel layer portion 260M and a horizontal extension portion 260E. The main channel layer portion 260M may extend on the first sidewall 130H1 in the vertical direction Z, and the horizontal extension portion 260E may be connected to a lower portion of the main channel layer portion 260M and extend in the second horizontal direction Y. The horizontal extension portion 260E may be on the upper surface of the source line SL.

On the channel layer 260, the gate insulating layer 154, the ferroelectric layer 152, and gate electrodes 240 may be sequentially arranged. A barrier layer 242 may be arranged between each gate electrode 240 and the ferroelectric layer 152.

Each gate electrode 240 may include a first vertical extension sidewall 240V1 and a second vertical extension sidewall 240V2, the first vertical extension sidewall 240V1 may face the ferroelectric layer 152, and the second vertical extension sidewall 240V2 may contact a second insulating layer 262. For example, the gate electrodes 240 may include a first gate electrode 240_1 and a second gate electrode 240_2 that are alternately arranged in the second horizontal direction Y, the first gate electrode 240_1 may be on the first channel layer 260_1, and the second gate electrode 240_2 may be on the second channel layer 260_2. For example, the second insulating layer 262 may be arranged between the first gate electrode 240_1 and the second gate electrode 240_2, and the third insulating layer 164 may be arranged on the first gate electrode 240_1, the second gate electrode 240_2, and the second insulating layer 262.

As illustrated in FIG. 8, the gate insulating layer 154 and the ferroelectric layer 152 may extend from a sidewall of the main channel layer portion 260M to an upper surface of the horizontal extension portion 260E. For example, the ferroelectric layer 152 may include a first portion 152P1, which extends on the sidewall of the main channel layer portion 260M of the channel layer 260 in the vertical direction Z, and a second portion 152P2, which extends on the upper surface of the horizontal extension portion 260E in the second horizontal direction Y.

As illustrated in FIG. 8, the first ferroelectric transistor FTR1 may be on the first sidewall 130H1 of the opening 130H, and the second ferroelectric transistor FTR2 may be on the second sidewall 130H2 of the opening 130H. The first ferroelectric transistor FTR1 and the second ferroelectric transistor FTR2 may each have an asymmetrical structure. Also, with respect to the center line CL1, the first ferroelectric transistor FTR1 and the second ferroelectric transistor FTR2 may have a mirror symmetry structure with respect to each other.

Figure 9:
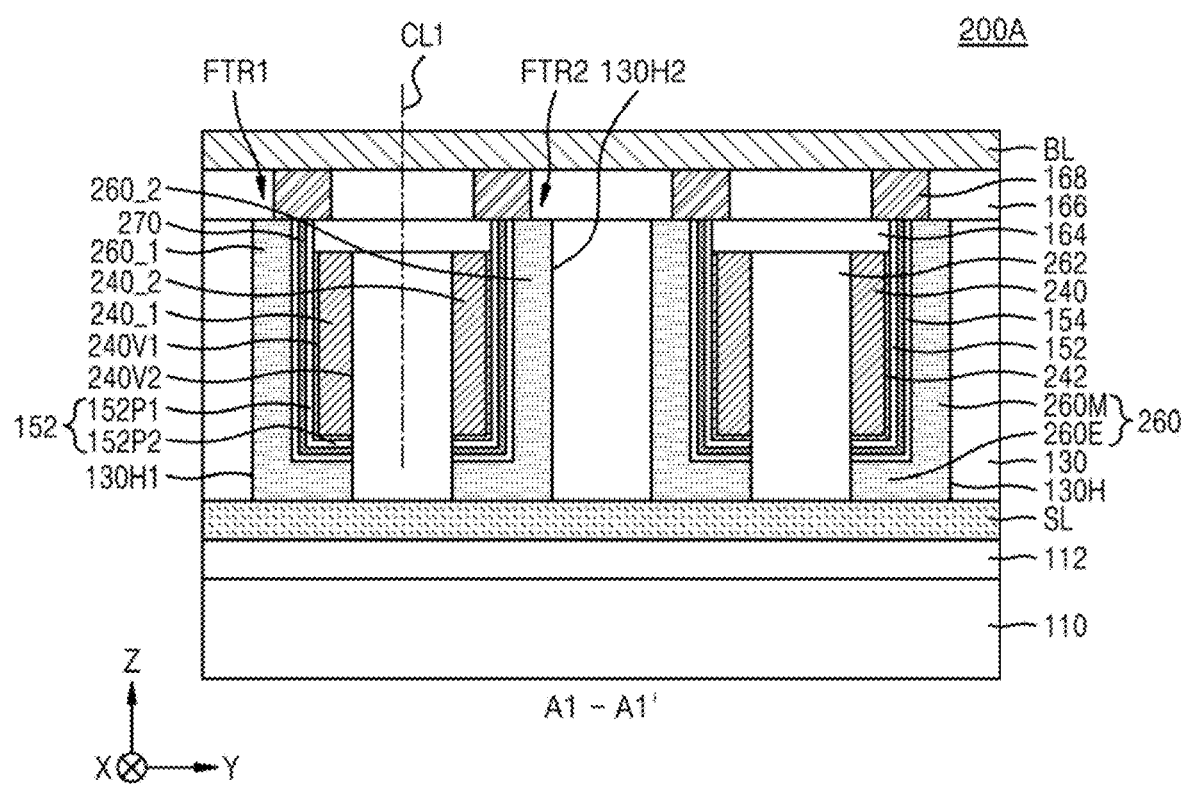
FIG. 9 is a cross-sectional view of a semiconductor device according to some example embodiments.

FIG. 9 is a cross-sectional view of a semiconductor device 200A according to some example embodiments. The same reference symbols in FIGS. 1 to 9 denote the same elements.

Referring to FIG. 9, the ferroelectric transistor FTR may further include a floating gate 270 arranged between the ferroelectric layer 152 and the gate insulating layer 154. In some example embodiments, the floating gate 270 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but is not limited thereto.

The floating gate 270 may have a portion vertically extending between the first vertical extension sidewall 240V1 of the gate electrode 240 and the main channel layer portion 260M of the channel layer 260. For example, a thickness of the floating gate 270 may be between about 10 nm to about 50 nm, but is not limited thereto.

Figure 10:
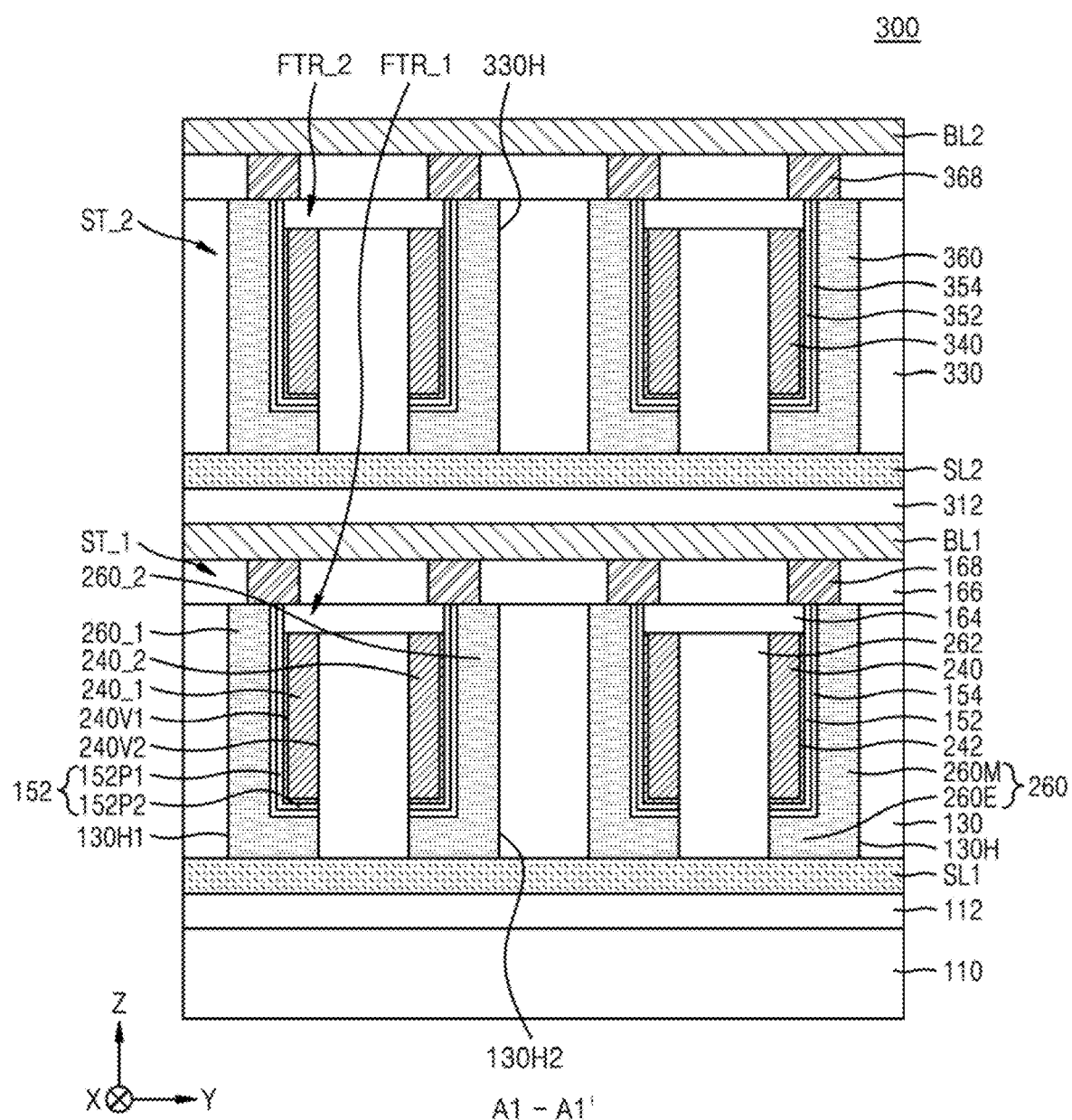
FIG. 10 is a cross-sectional view of a semiconductor device according to some example embodiments.

FIG. 10 is a cross-sectional view of a semiconductor device 300 according to some example embodiments. The same reference symbols in FIGS. 1 to 10 denote the same elements.

Referring to FIG. 10, the semiconductor device 300 may include a first array stack ST_1 and a second array stack ST_2 that is at a higher level than the first array stack ST_1. The first array stack ST_1 may include a plurality of first source lines SL1 arranged on the substrate 110, a plurality of first bit lines BL1 arranged on the first source lines SL1, and a plurality of first ferroelectric transistors FTR_1 arranged at separate, respective (e.g., different) cross points of the first source lines SL1 and the first bit lines BL1 (e.g., points at which the first source lines SL1 and the first bit lines BL1 overlap in the vertical direction Z, such that the first ferroelectric transistors FTR_1 each overlap at least one first source line SL1 and at least one first bit line BL1 in the vertical direction Z). The second array stack ST_2 may include a plurality of second source lines SL2, which are arranged at a higher level than the first bit lines BL1, a plurality of second bit lines BL2 arranged on the second source lines SL2, and a plurality of second ferroelectric transistors FTR_2 arranged at separate, respective (e.g., different) cross points of the second source lines SL2 and the second bit lines BL2 (e.g., points at which the second source lines SL2 and the second bit lines BL2 overlap in the vertical direction Z, such that the second ferroelectric transistors FTR_2 each overlap at least one second source line SL2 and at least one second bit line BL2 in the vertical direction Z).

In the present specification, the term 'level' may mean a vertical height and/or a distance from a reference location (e.g., the upper surface 110s of the substrate 110, a lower surface of the substrate 110, or the like) in a vertical direction (e.g., a vertical direction Z that extends perpendicular or substantially perpendicular to at least one of the upper surface 110s of the substrate 110, the lower surface of the substrate 110, or the like). For example, when a first element is described herein to be at a higher level than a second element, the first element may be further from the reference location in the vertical direction than the second element. In another example, when a first element is described herein to be at a lower level than a second element, the first element may be closer to the reference location in the vertical direction than the second element. In another example, when a first element is described herein to be at a same level as a second element, the first element may be equally distant from/close to the reference location in the vertical direction as the second element.

An interlayer insulating layer 312 may be further arranged between the first array stack ST_1 and the second array stack ST_2. The second ferroelectric transistor FTR_2 may include a channel layer 360 arranged in an opening 330H penetrating an insulating layer 330, a gate insulating layer 354, a ferroelectric layer 352, and gate electrodes 340. A bit line contact 368 may electrically connect the channel layer 360 to the second bit line BL2.

FIG. 10 illustrates that each of the first and second array stacks ST_1 and ST_2 includes the ferroelectric transistor FTR of the semiconductor device 200 of FIG. 8, and the channel layers 260 and 360 are arranged on the sidewalls of the openings 130H and 330H, respectively. Unlike the illustration, however, each of the first and second array stacks ST_1 and ST_2 may include the ferroelectric transistor FTR of any one of the semiconductor devices 100, 100A, 100B, 100C, 100D, and 200A of FIGS. 3 to 7 and 9.

In addition, FIG. 10 illustrates the semiconductor device 300 having a two-stack structure in which the second array stack ST_2 is arranged on the first array stack ST_1, but in other embodiments, one or more additional array stacks may be further arranged on the second array stack ST_2.

Figure 11:
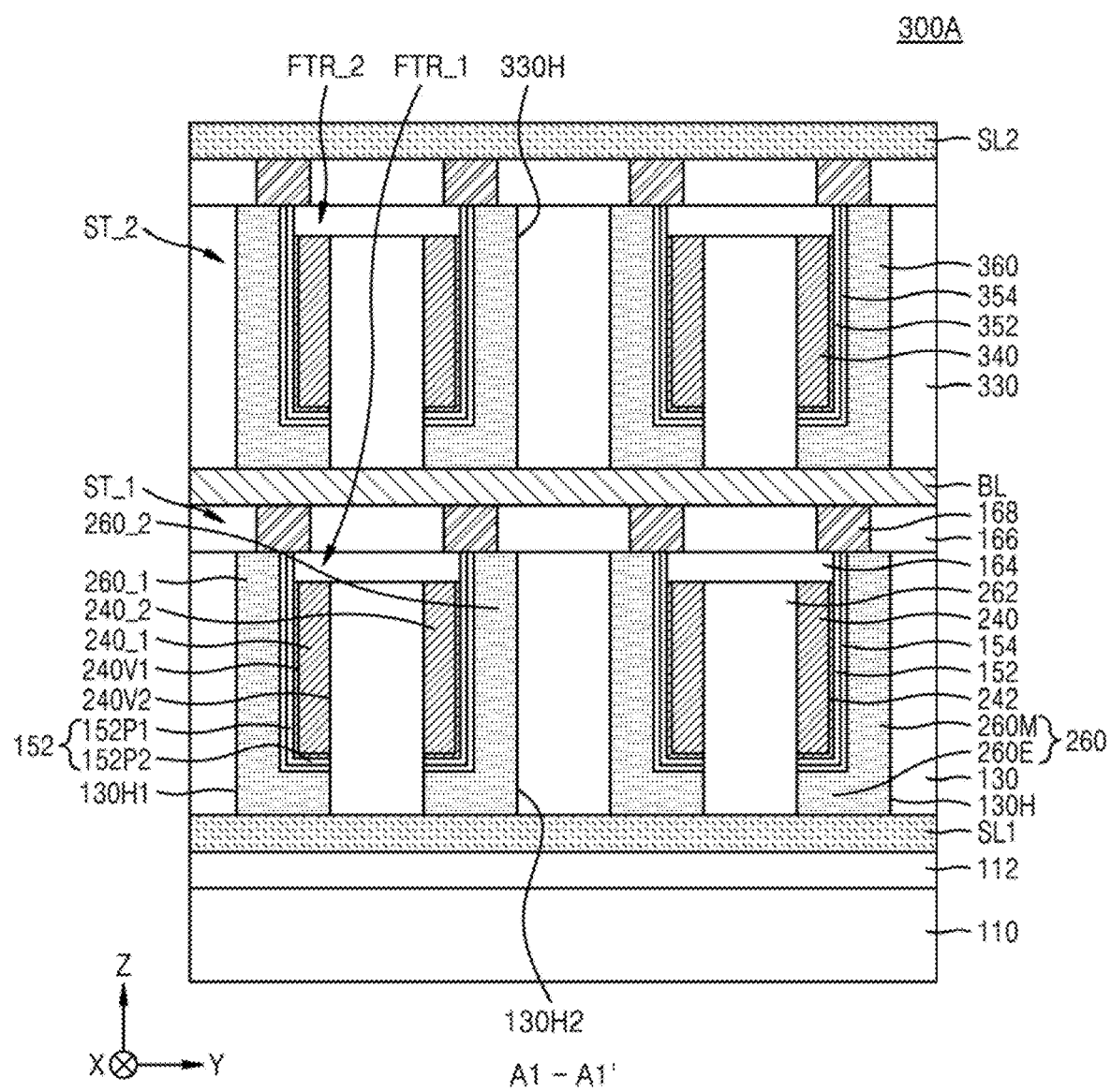
FIG. 11 is a cross-sectional view of a semiconductor device according to some example embodiments.

FIG. 11 is a cross-sectional view of a semiconductor device 300A according to some example embodiments. The same reference symbols in FIGS. 1 to 11 denote the same elements.

Referring to FIG. 11, the first array stack ST_1 and the second array stack ST_2 may share the bit line BL. For example, the first array stack ST_1 may include the plurality of first source lines SL1 arranged on the substrate 110, the plurality of bit lines BL arranged on the first source lines SL1, and the plurality of first ferroelectric transistors FTR_1 arranged at cross points of the first source lines SL1 and the bit lines BL. The second array stack ST_2 may include the plurality of bit lines BL, the plurality of second source lines SL2 arranged on the bit lines BL, and the plurality of second ferroelectric transistors FTR_2 arranged at cross points of the bit lines BL and the second source lines SL2. The interlayer insulating layer 312 may be omitted.

Figure 12:
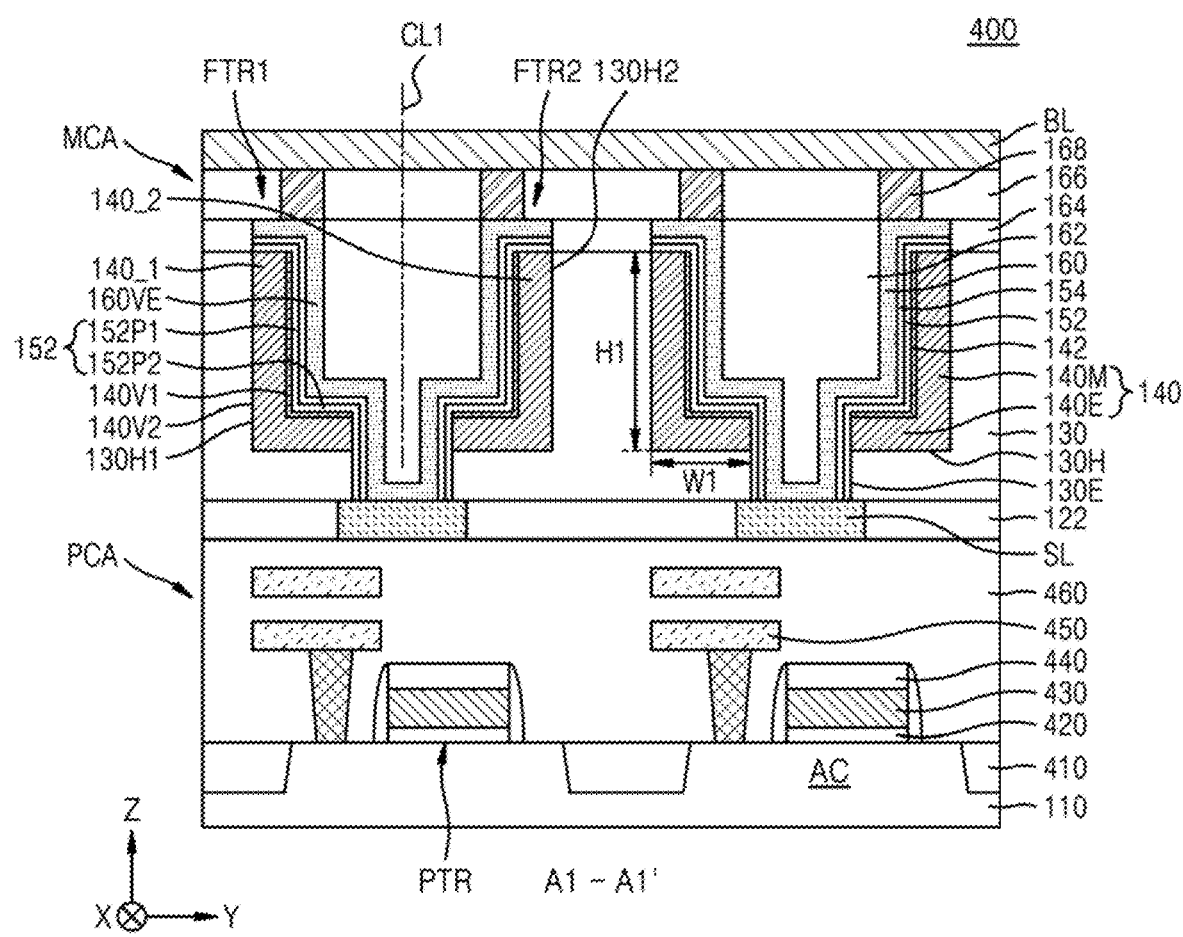
FIG. 12 is a cross-sectional view of a semiconductor device according to some example embodiments.

FIG. 12 is a cross-sectional view of a semiconductor device 400 according to some example embodiments. The same reference symbols in FIGS. 1 to 12 denote the same elements.

Referring to FIG. 12, the semiconductor device 400 may have a cell over periphery (COP) structure. For example, the peripheral circuit area PCA may be arranged on the substrate 110, and the cell array area MCA may be arranged at a higher vertical level than the peripheral circuit area PCA.

A device isolation layer 410 defining an active area AC may be arranged on the substrate 110. In the active area AC, a peripheral circuit transistor PTR may be arranged. The peripheral circuit transistor PTR may include a gate dielectric layer 420, a peripheral circuit gate electrode 430, and a gate capping pattern 440 sequentially arranged on the substrate 110.

The gate dielectric layer 420 may include at least one of a silicon oxide layer, a silicon nitride layer, a silicon oxynitride layer, oxide/nitride/oxide (ONO), and a high-k dielectric layer having a greater dielectric constant than the silicon oxide layer. The peripheral circuit gate electrode 430 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RUO$_x$, or a combination thereof. The gate capping pattern 440 may include silicon nitride.

A peripheral circuit wiring layer 450 electrically connected to the peripheral circuit transistor PTR may be arranged on the substrate 110, and an interlayer insulating layer 460 covering the peripheral circuit wiring layer 450 may be arranged on the substrate 110.

The plurality of source lines SL, the plurality of bit lines BL, and the plurality of first and second ferroelectric transistors FTR1 and FTR2, which are arranged at cross points of the source lines SL and the bit lines BL, may be arranged on the interlayer insulating layer 460.

FIG. 12 illustrates a structure in which the peripheral circuit transistor PTR is formed on the substrate 110 and the cell array area MCA is formed at a higher level than the peripheral circuit transistor PTR. Unlike the illustration of FIG. 12, however, a structure, in which the peripheral circuit transistor PTR is formed on an additional substrate (not illustrated), the cell array area MCA is formed on the substrate 110, and the additional substrate adheres to the substrate 110 according to a copper-to-copper bonding method, may be realized.

FIGS. 13, 14, 15, 16, 17, 18, 19, 20, 21, and 22 are cross-sectional views of a manufacturing method of the semiconductor device 100, according to some example embodiments. The same reference symbols in FIGS. 1 to 22 denote the same elements.

Figure 13:
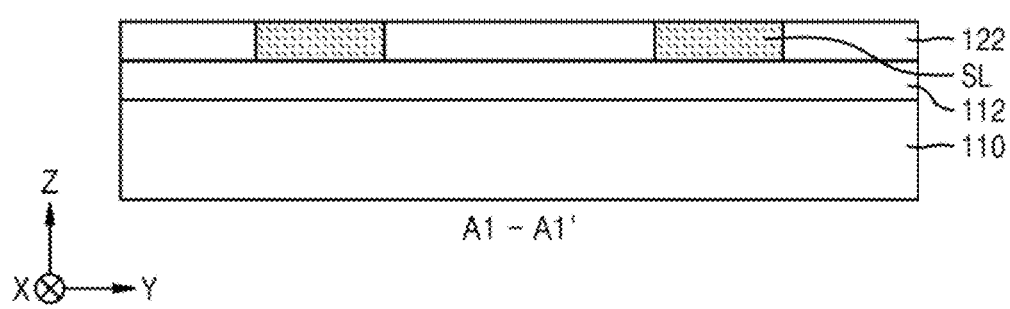
FIGS. 13, 14, 15, 16, 17, 18, 19, 20, 21, and 22 are cross-sectional views of a manufacturing method of a semiconductor device, according to some example embodiments.

Referring to FIG. 13, the lower insulating layer 112 is formed on the substrate 110. Then, the plurality of source lines SL extending in the first horizontal direction X and the source line insulating layer 122 filling a space between the source lines SL may be formed on the lower insulating layer 112.

Figure 14:
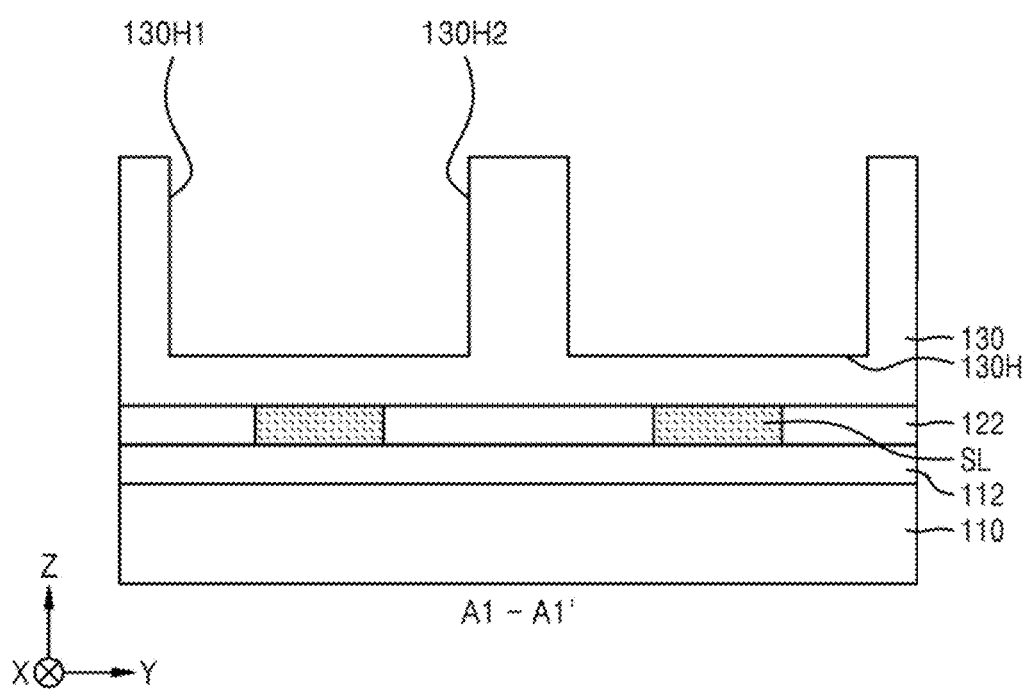

Referring to FIG. 14, the first insulating layer 130 may be formed on the plurality of source lines SL and the source line insulating layer 122. The first insulating layer 130 may be formed to have a relatively great height in the vertical direction Z by using at least one of silicon oxide, silicon nitride, or silicon oxynitride.

Then, a mask pattern (not illustrated) may be formed on the first insulating layer 130, and the plurality of openings 130H may be formed by using the mask pattern as an etch mask. The openings 130H may not penetrate the entire height of the first insulating layer 130, and the upper surface of the source line SL may not be exposed at the bottom portion of the opening 130H.

The openings 130H may extend in the first horizontal direction X, and for example, the openings 130H may include the first sidewall 130H1 and the second sidewall 130H2 that are opposite to each other. The first sidewall 130H1 and the second sidewall 130H2 may face each other and extend in the first horizontal direction X.

Figure 15:
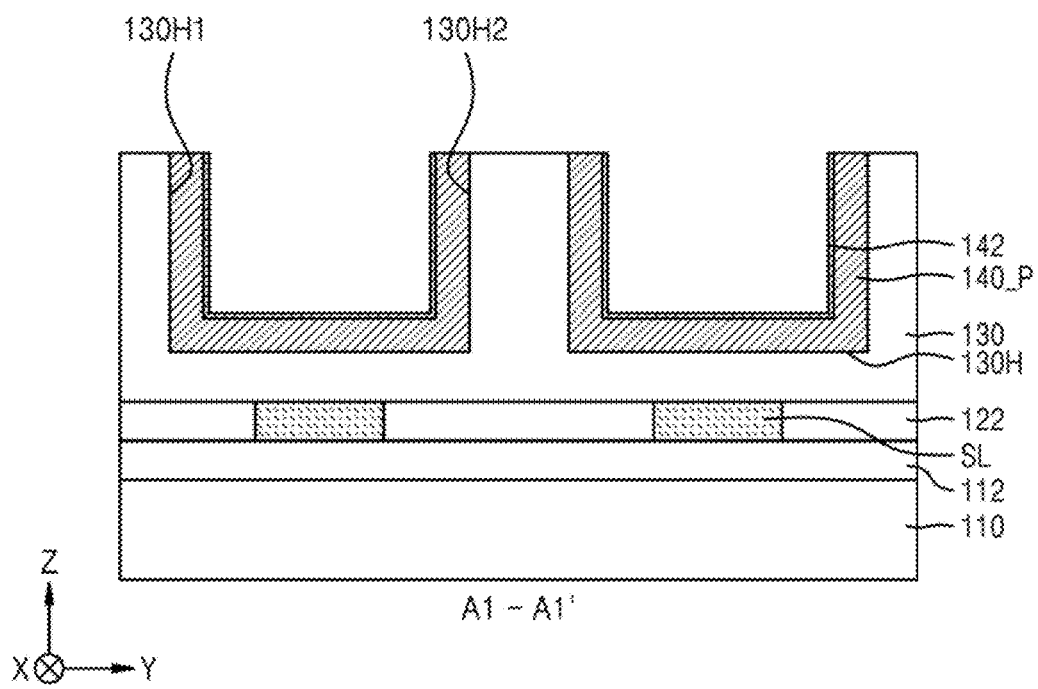

Referring to FIG. 15, a conductive layer 140_P may be formed on the first insulating layer 130 to conformally cover an inner wall of the opening 130H, and the barrier layer 142 may be formed on the conductive layer 140_P. Then, portions of the conductive layer 140_P and the barrier layer 142 may be etched back so that the upper surface of the first insulating layer 130 is exposed, and thus, the conductive layer 140_P and the barrier layer 142 may remain on the inner wall of the opening 130H.

In some example embodiments, the conductive layer 140_P may include Ti, TiN, Ta, TaN, W, WN, TiSiN, WSiN, polysilicon, or a combination thereof. The barrier layer 142 may be formed by using at least one of TiN, TaN, TiAl, or TiAlC.

Figure 16:
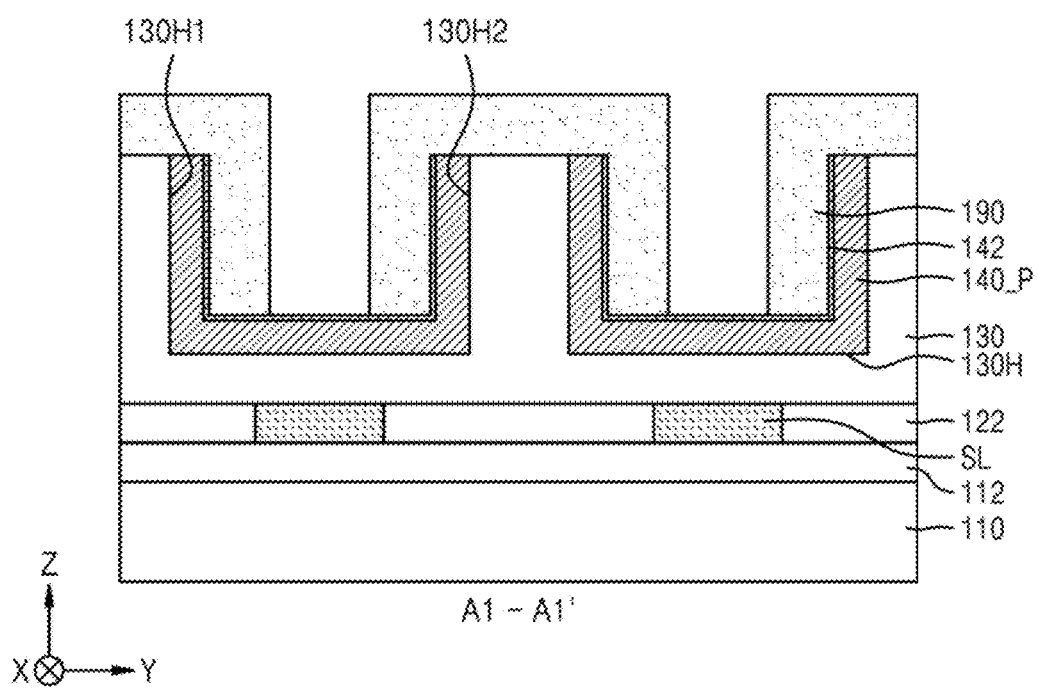

Referring to FIG. 16, a sacrificial layer 190 may be formed on the conductive layer 140_P and the barrier layer 142 at a thickness large enough to completely fill the inside of the opening 130H. In some example embodiments, the sacrificial layer 190 may include at least one of silicon oxide, silicon carbide, a spin on hard mask (SOH), or silicon carbon oxide (SiOC).

Then, a mask pattern (not illustrated) may be formed on the sacrificial layer 190, and a portion of the sacrificial layer 190 may be removed by using the mask pattern as an etch mask. For example, the sacrificial layer 190 may be arranged to cover the first and second sidewalls 130H1 and 130H2 of the opening 130H and extend in the first horizontal direction X.

As the sacrificial layer 190 is formed in a line shape to extend in the first horizontal direction X, portions of the conductive layer 140_P and the barrier layer 142, which are on the bottom portion of the opening 130H, may not be covered by the sacrificial layer 190 and be exposed.

Figure 17:
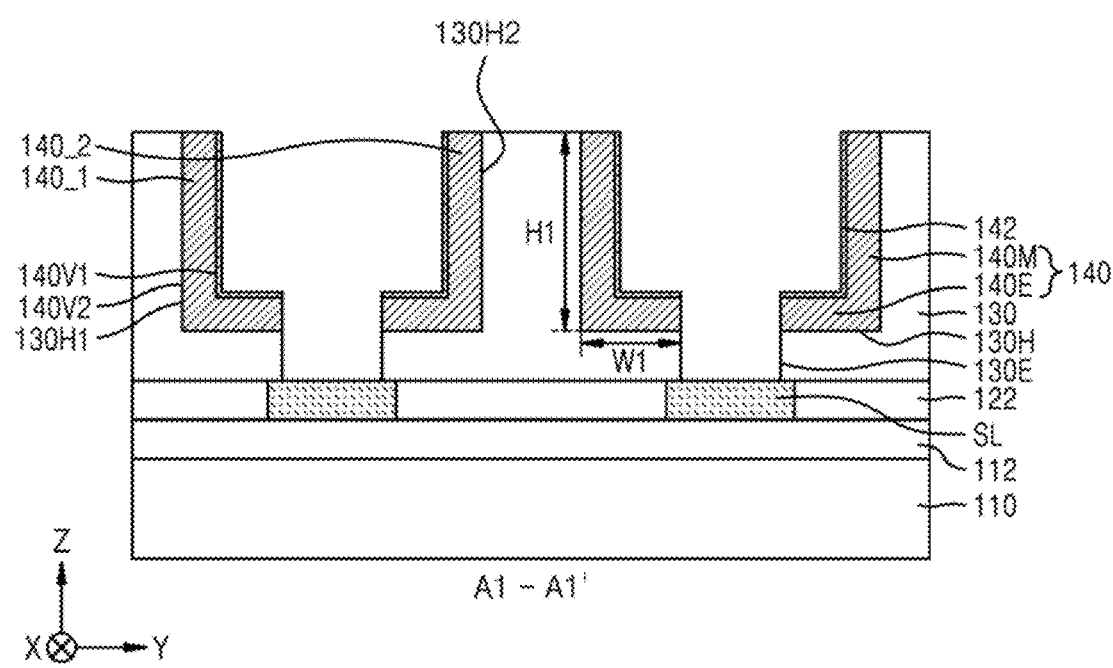

Referring to FIG. 17, portions of the conductive layer 140_P and the barrier layer 142, which are not covered by the sacrificial layer 190, are etched back to expand the bottom portion of the opening 130H downwards in the vertical direction Z, and the gate electrodes 140 may be formed inside the opening 130H. The upper surface of the source line SL may be exposed by further removing a portion of the first insulating layer 130 that is exposed at the bottom portion of the opening 130H. Here, the portion of the opening 130H extending downwards may be referred to as the bottom opening 130E.

The gate electrodes 140 may include the first gate electrode 140_1 and the second gate electrode 140_2 that are apart from each other by the bottom opening 130E. The first gate electrode 140_1 may indicate a portion of the conductive layer 140_P arranged on the first sidewall 130H1 of the opening 130H, and the second gate electrode 140_2 may indicate a portion of the conductive layer 140_P arranged on the second sidewall 130H2 of the opening 130H.

Figure 18:
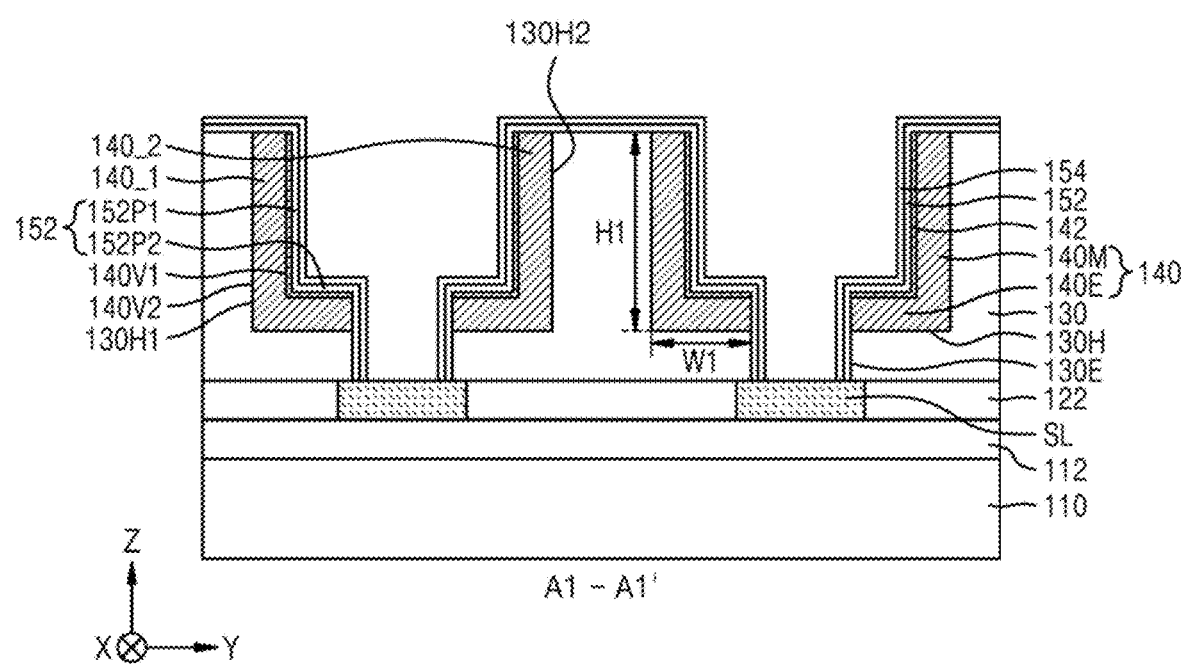

Referring to FIG. 18, the ferroelectric layer 152 and the gate insulating layer 154, which conformally cover the inside of the opening 130H, may be sequentially formed on the first insulating layer 130 and the upper surface of the gate electrode 140.

In some example embodiments, the ferroelectric layer 152 may include hafnium-based oxide having an orthorhombic crystal structure, and for example, the hafnium-based oxide may include an o-phase having the orthorhombic crystal structure. In some example embodiments, the ferroelectric layer 152 may have a thickness less than or equal to about 10 nm.

In some example embodiments, the upper surface of the source line SL may be exposed again by further performing an etch-back process of removing portions of the ferroelectric layer 152 and the gate insulating layer 154 arranged inside the bottom opening 130E.

Figure 19:
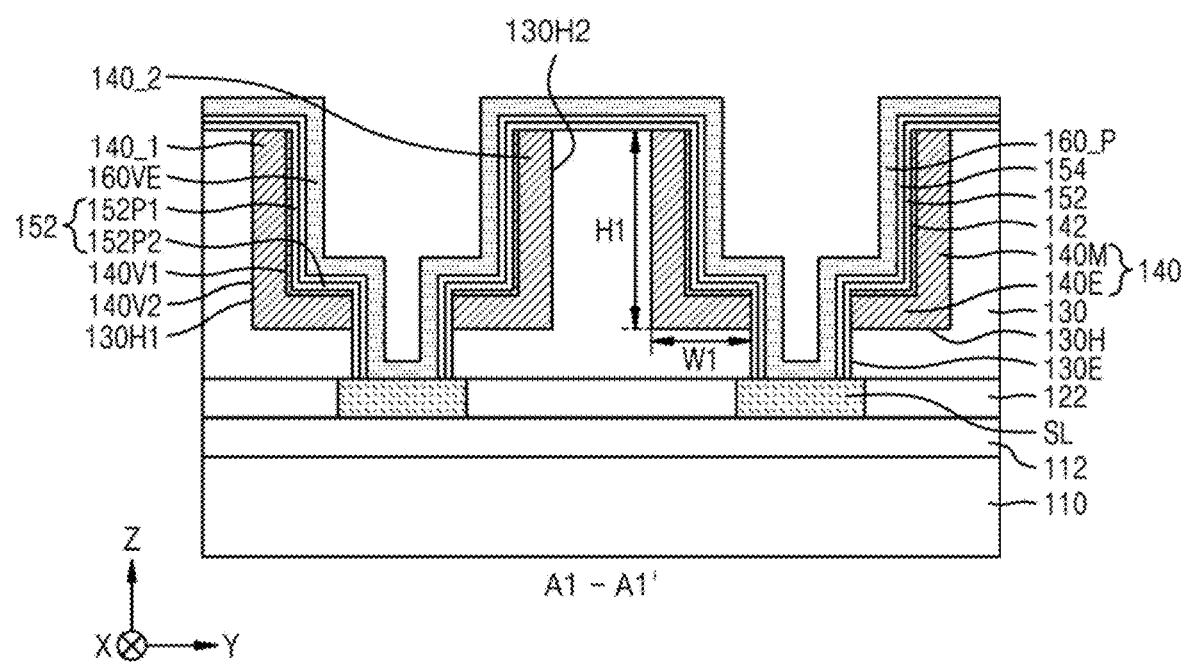

Referring to FIG. 19, a preliminary channel layer 160_P may be formed on the gate insulating layer 154. The preliminary channel layer 160_P may be conformally arranged on the inner wall of the opening 130H.

In some example embodiments, the preliminary channel layer 160_P may be formed by using at least one of polysilicon, Si—Ge, Ge, IGZO, Sn-doped IGZO, IWO, IZO, ZTO, YZO, $CuS_2$, $CuSe_2$, $MoS_2$, $MoSe_2$, $WSe_2$, or $WS_2$. The preliminary channel layer 160_P may be formed through at least one of a chemical vapor deposition (CVD) process, a low-pressure CVD process, a plasma-enhanced CVD process, a metalorganic CVD (MOCVD) process, or an atomic layer deposition process.

Figure 20:
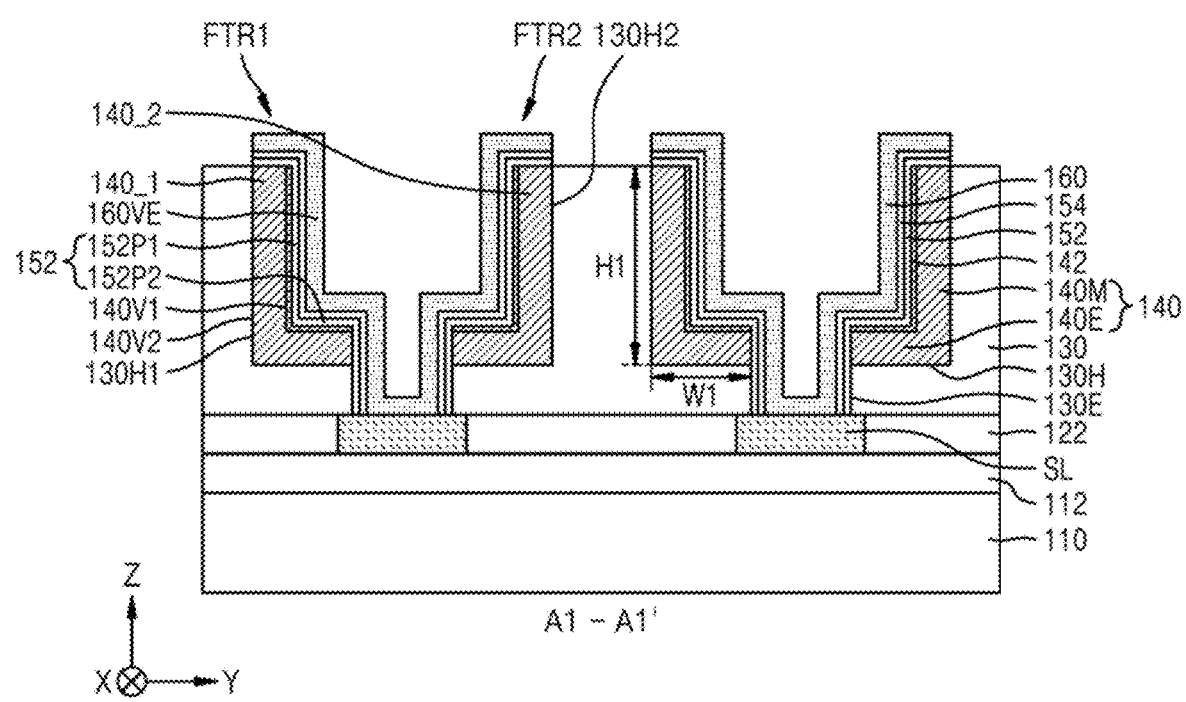

Referring to FIG. 20, the channel layers 160 may be formed by forming a mask pattern (not illustrated) on the preliminary channel layer 160_P and patterning the preliminary channel layer 160_P by using the mask pattern. The channel layers 160 may be apart from each other in the first horizontal direction X. Each channel layer 160 may have a width that is substantially the same as or greater than a width of one opening 130H in the second horizontal direction Y, and accordingly, the channel layer 160 may vertically overlap the first gate electrode 140_1 and the second gate electrode 140_2 that are arranged in one opening 130H in the second horizontal direction Y.

Figure 21:
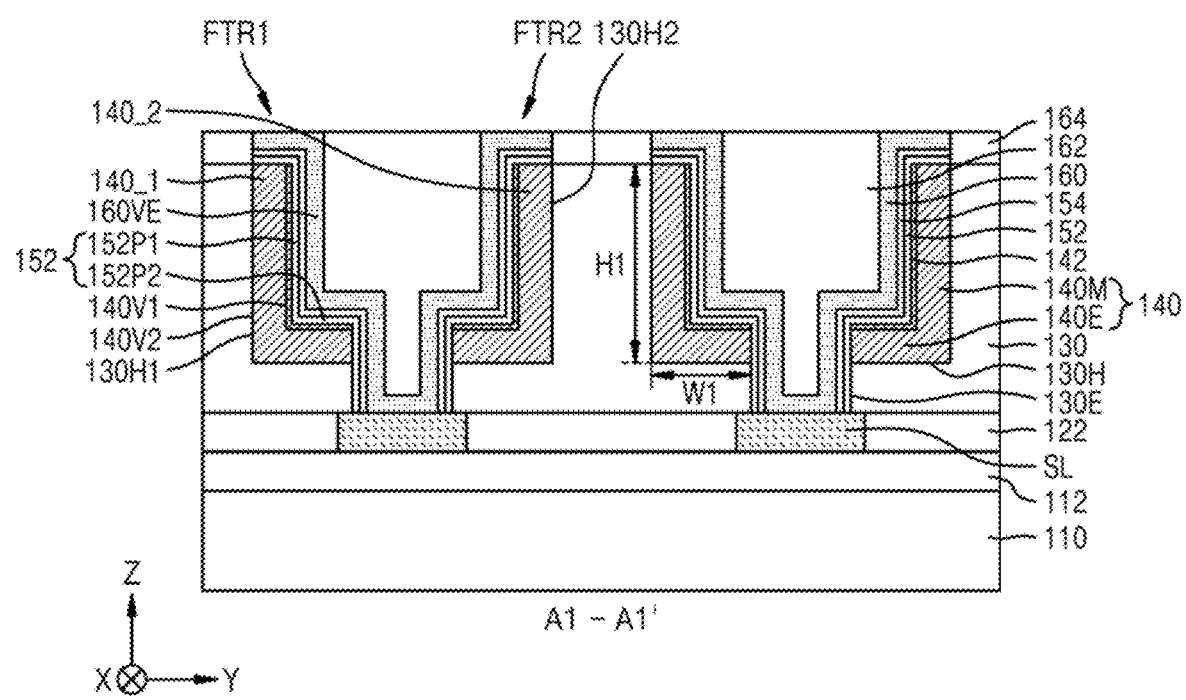

Referring to FIG. 21, an insulating layer (not illustrated) may be formed on the channel layer 160, and an upper portion of the insulating layer may be planarized to form the second insulating layer 162 filling the inside of the openings 130H and form the third insulating layer 164 arranged on the upper surface of the first insulating layer 130. The second insulating layer 162 and the third insulating layer 164 may have upper surfaces that are at the same level as the upper surface of the channel layer 160.

Figure 22:
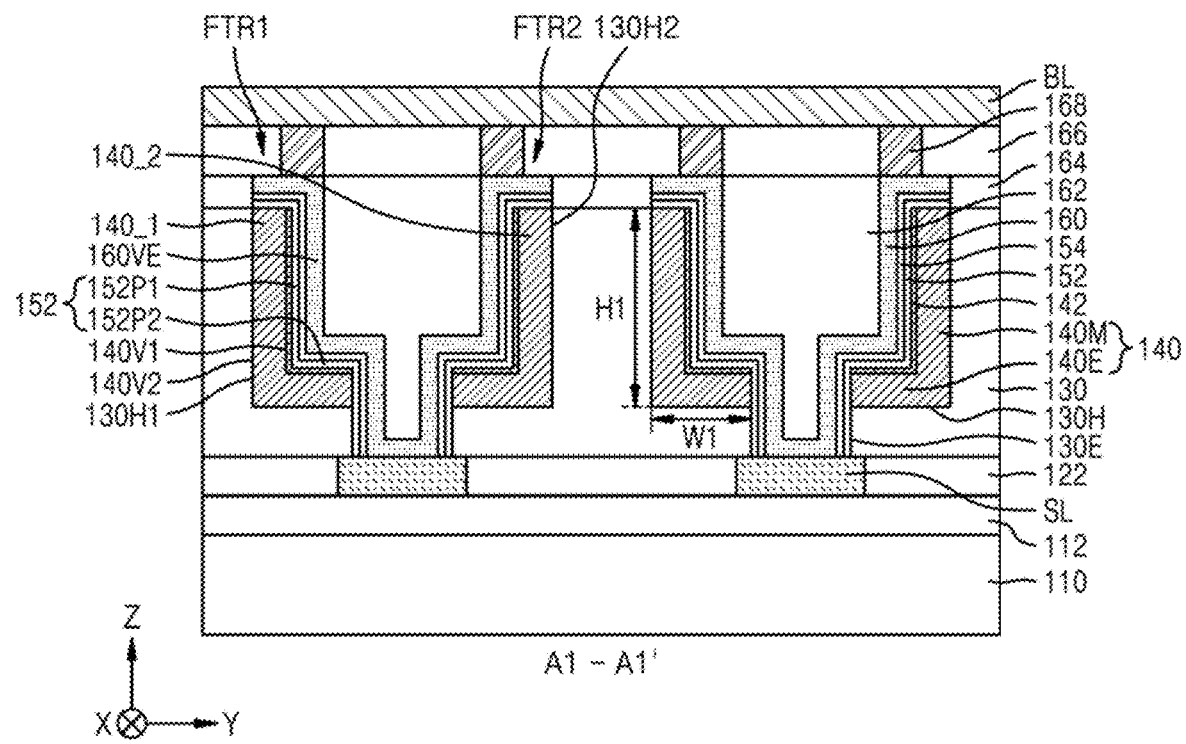

Referring to FIG. 22, the fourth insulating layer 166 may be formed on the second insulating layer 162 and the third insulating layer 164. Then, openings (not illustrated) penetrating the fourth insulating layer 166 may be formed, and the bit line contact 168 may be formed by filling a conductive material inside the openings.

Then, the bit lines BL may be formed on the bit line contact 168 and the fourth insulating layer 166.

The semiconductor device 100 may be completely manufactured by performing the above processes.

In general, a DRAM device may have a 1T-1C structure including a cell transistor and a capacitor. In particular, a process of forming a capacitor may be highly complicated, and the amount of power consumed during a refresh operation, etc. may be relatively great.

According to some example embodiments, however, the gate electrodes 140 having an asymmetrical gate structure and the ferroelectric layer 152 and the channel layer 160, which are arranged on the first vertical extension sidewall 140V1 of the gate electrode 140, form the first and second ferroelectric transistors FTR1 and FTR2, and thus, it may be advantageous for performing scaling in the vertical direction Z and improve the integration of the semiconductor device 100. Also, data may be stored in the semiconductor device 100 using residual polarization formed in the ferroelectric layer 152, and a non-volatile memory device having a 1T structure that does not require a separate capacitor configured to store data may be formed. Therefore, a leakage current, a floating body effect, etc. may be prevented in the semiconductor device 100, and the semiconductor device 100 may be driven with relatively low power.

According to the process described with reference to FIG. 14, the channel layers 160 may be formed first on the inner wall of the openings 130H instead of the gate electrodes 140, and the gate insulating layer 154, the ferroelectric layer 152, and the gate electrodes 140 may be sequentially formed on the channel layers 160. In this case, the semiconductor device 200 described with reference to FIG. 8 may be manufactured.

Also, according to the process described with reference to FIG. 18, after the ferroelectric layer 152 is formed on the inner wall of the openings 130H, the floating gate 170 may be further formed on the ferroelectric layer 152 before the gate insulating layer 154 is formed. In this case, the semiconductor device 100C described with reference to FIG. 7 may be manufactured.

Also, according to the process described with reference to FIG. 19, the preliminary channel layer 160_P may be formed at a thickness large enough to completely fill the bottom opening 130E in a process of forming the preliminary channel layer 160_P. In this case, the semiconductor device 100A described with reference to FIG. 4 may be manufactured.

While the inventive concepts have been particularly shown and described with reference to some example embodiments thereof, it will be understood that various changes in form and details may be made therein without departing from the spirit and scope of the following claims.

What is claimed is:

1. A semiconductor device, comprising:
a plurality of gate electrodes extending on a substrate in a first horizontal direction that is parallel to an upper surface of the substrate, wherein each gate electrode of the plurality of gate electrodes includes a first vertical extension sidewall and a second vertical extension sidewall that are opposite to each other;
a channel layer on the first vertical extension sidewall of each gate electrode of the plurality of gate electrodes, the channel layer including a vertical extension portion;
a ferroelectric layer and a gate insulating layer that are sequentially located between the channel layer and the first vertical extension sidewall of each gate electrode of the plurality of gate electrodes;
an insulating layer on the second vertical extension sidewall of each gate electrode of the plurality of gate electrodes; and
a plurality of bit lines electrically connected to the channel layer and extending in a second horizontal direction that is different from the first horizontal direction and is parallel to the upper surface of the substrate.

2. The semiconductor device of claim 1, wherein each gate electrode of the plurality of gate electrodes comprises:
a main gate portion extending in a vertical direction that is perpendicular to the upper surface of the substrate; and
a horizontal extension portion connected to the main gate portion and extending in the second horizontal direction,
wherein the main gate portion comprises the first vertical extension sidewall of the gate electrode and the second vertical extension sidewall of the gate electrode.

3. The semiconductor device of claim 2, wherein the plurality of gate electrodes each have an L-shaped vertical cross-section.

4. The semiconductor device of claim 2, wherein the ferroelectric layer comprises:
a first portion extending, in the vertical direction, on the first vertical extension sidewall of each gate electrode of the plurality of gate electrodes; and
a second portion arranged on the horizontal extension portion of each gate electrode of the plurality of gate electrodes.

5. The semiconductor device of claim 2, wherein the plurality of gate electrodes comprise:
a first gate electrode and a second gate electrode that are alternately arranged in the second horizontal direction, wherein the first gate electrode and the second gate electrode are mirror-symmetrical with respect to each other.

6. The semiconductor device of claim 1, wherein the channel layer comprises:
a main channel layer portion extending in a vertical direction perpendicular to the upper surface of the substrate; and
a horizontal extension portion connected to the main channel layer portion and extending in the second horizontal direction.

7. The semiconductor device of claim 6, wherein the channel layer has an L-shaped vertical cross-section.

8. The semiconductor device of claim 6, wherein the ferroelectric layer comprises:
a first portion extending, in the vertical direction, between the first vertical extension sidewall of each gate electrode of the plurality of gate electrodes and the main channel layer portion of the channel layer; and
a second portion between a bottom surface of each gate electrode of the plurality of gate electrodes and the horizontal extension portion of the channel layer.

9. The semiconductor device of claim 6, wherein the channel layer comprises:
a first channel layer and a second channel layer that are alternately arranged in the second horizontal direction, and
the first channel layer and the second channel layer are mirror-symmetrical with respect to each other.

10. The semiconductor device of claim 1, further comprising a floating gate electrode that is between the ferroelectric layer and the gate insulating layer.

11. The semiconductor device of claim 1, wherein
the ferroelectric layer comprises a ferroelectric material that has a chemical formula of $Hf_xM_{1-x}O_y$ (0<x<1, 2≤y≤4, wherein M is at least one of zirconium (Zr), silicon (Si), aluminum (Al), yttrium (Y), gadolinium (Gd), lanthanum (La), scandium (Sc), or strontium (Sr)), and
the ferroelectric material has an orthorhombic crystal structure.

12. The semiconductor device of claim 1, wherein the channel layer comprises at least one of polysilicon, silicon-germanium, germanium (Ge), InGaZnOx (IGZO), Sn-doped IGZO, W-doped InOx (IWO), InZnOx (IZO), ZnSnOx (ZTO), YZnOx (YZO), copper sulfide ($CuS_2$), copper diselenide ($CuSe_2$), molybdenum disulfide ($MoS_2$), molybdenum diselenide ($MoSe_2$), tungsten diselenide ($WSe_2$), or tungsten disulfide ($WS_2$).

* * * * *